(12) United States Patent
Oka

(10) Patent No.: US 7,242,100 B2
(45) Date of Patent: Jul. 10, 2007

(54) METHOD FOR MANUFACTURING SEMICONDUCTOR DEVICE WITH PLURAL SEMICONDUCTOR CHIPS

(75) Inventor: Hiroshi Oka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 30 days.

(21) Appl. No.: 11/032,840

(22) Filed: Jan. 10, 2005

(65) Prior Publication Data

US 2005/0153480 A1 Jul. 14, 2005

Related U.S. Application Data

(62) Division of application No. 10/655,699, filed on Sep. 5, 2003, now Pat. No. 7,157,385, and a division of application No. 10/122,982, filed on Apr. 11, 2002, now Pat. No. 6,861,760, which is a division of application No. 09/166,260, filed on Oct. 5, 1998, now Pat. No. 6,441,495.

(30) Foreign Application Priority Data

Oct. 6, 1997  (JP) .................................. 9-272702
Oct. 29, 1997 (JP) .................................. 9-297428

(51) Int. Cl.
*H01L 23/48* (2006.01)
(52) U.S. Cl. ............... 257/778; 257/777; 257/686; 257/E21.525; 257/E21.023; 438/108
(58) Field of Classification Search ........ 257/778–779; 438/14–15
See application file for complete search history.

(56) References Cited

U.S. PATENT DOCUMENTS

| 4,541,003 A | 9/1985 | Otsuka et al. |
| 5,192,371 A | 3/1993 | Shuto et al. |
| 5,296,737 A | 3/1994 | Nishimura et al. |
| 5,329,423 A | 7/1994 | Scholz |
| 5,331,235 A | 7/1994 | Chun |
| 5,502,289 A | 3/1996 | Takiar et al. |
| 5,614,766 A | 3/1997 | Takasu et al. |
| 5,640,044 A | 6/1997 | Takehashi et al. |
| 5,770,480 A | 6/1998 | Ma et al. |
| 5,801,432 A | 9/1998 | Rostoker et al. |

(Continued)

FOREIGN PATENT DOCUMENTS

EP    000527044 A1   2/1993

(Continued)

*Primary Examiner*—Dung A. Le
(74) *Attorney, Agent, or Firm*—Hamre, Schumann, Mueller & Larson, P.C.

(57) ABSTRACT

A method for manufacturing a semiconductor device with plural semiconductor chips is provided. The method includes the step of attaching a second semiconductor chip to a first surface of a supporting member in a manner such that a third set of electrodes are wirelessly connected to the supporting member at positions outwardly from an opening of the supporting member. The method also includes the step of mounting a first semiconductor chip to the second semiconductor chip in a manner such that the main surfaces of the first and second semiconductor chips face each other while a first set of electrodes of the first semiconductor chip are wirelessly connected to a second set of electrodes in the opening of the supporting member.

3 Claims, 16 Drawing Sheets

U.S. PATENT DOCUMENTS

| | | |
|---|---|---|
| 5,814,881 A | 9/1998 | Alagaratnam et al. |
| 5,831,441 A | 11/1998 | Motooka et al. |
| 5,877,478 A | 3/1999 | Ando |
| 5,898,220 A | 4/1999 | Ball |
| 5,953,589 A | 9/1999 | Shim et al. |
| 6,005,292 A | 12/1999 | Roldan et al. |
| 6,025,648 A | 2/2000 | Takahashi et al. |
| RE36,613 E | 3/2000 | Ball |
| 6,069,025 A | 5/2000 | Kim |
| 6,072,243 A | 6/2000 | Nakanishi |
| 6,077,724 A | 6/2000 | Chen |
| 6,080,264 A * | 6/2000 | Ball .................. 156/292 |
| 6,166,443 A | 12/2000 | Inaba et al. |
| 6,184,574 B1 | 2/2001 | Bissey |
| 6,441,495 B1 | 8/2002 | Oka et al. |
| 6,639,315 B2 | 10/2003 | Kazama et al. |

FOREIGN PATENT DOCUMENTS

| | | |
|---|---|---|
| JP | 404368167 | 12/1992 |
| JP | 408316300 A | 11/1996 |

\* cited by examiner

METHOD FOR MANUFACTURING SEMICONDUCTOR DEVICE WITH PLURAL SEMICONDUCTOR CHIPS

CROSS REFERENCE TO RELATED APPLICATION

This application is a division of Ser. No. 10/122,982, filed Apr. 11, 2002, now U.S. Pat. No. 6,861,760 which is a divisional of application Ser. No. 09/166,260, filed Oct. 5, 1998, now U.S. Pat. No. 6,441,495 which applications are incorporated herein by reference.

This application is a divisional of U.S. application Ser. No. 10/655,699, filed Sep. 5, 2003, now U.S. Pat. No. 7,157,385.

BACKGROUND OF THE INVENTION

1. Field of the Invention

The present invention relates to a semiconductor device comprising a plurality of semiconductor chips stacked in the direction of thickness, and a method for making the same.

2. Background Art

There is known a type of semiconductor device in which a plurality of semiconductor chips are stacked and sealed in a resin package for drastically increased circuit mounting density. Such a semiconductor device is called "chip-on-chip" type because of the stacking arrangement in which one of the chips is mounted on another.

FIG. 29 shows an arrangement of a prior art chip-on-chip semiconductor device. As understood from the figure, in this arrangement, a plurality of semiconductor chips 9a–9c are stacked successively on a surface of a substrate 90. According to such an arrangement, an area occupied by the semiconductor chips 9a–9c on the surface of substrate 90 is small, advantageously increasing the mounting density of the semiconductor devices.

However, the prior art has following problems.

Specifically, when the plurality of semiconductor devices 9a–9c are stacked, respective electrodes 94a–94c are elevated accordingly to higher locations. As a result, the electrodes 94c of the highest semiconductor 9c are located disadvantageously high (height difference Ha), away from the surface of substrate 90 formed with terminals 92 to which the electrodes 94a–94c are to be connected via respective pieces of wire 93.

Under such a situation, it is sometimes difficult to make a proper connection between the electrode 94c and the terminal 92 because of the big height difference Ha. Specifically, in a conventional wirebonding machine, a capillary can perform a proper bonding only within a vertical range of ±300 μm away from its baseline height. Sometimes, however, the height difference Ha is greater than the upper limit (i.e. greater than the baseline height added with +300 μm), making impossible to use the wirebonding machine for the wirebonding operation. In addition, when the height difference Ha is large, as shown in FIG. 30, the capillary 95 has to be significantly tilted when the capillary 95 presses the wire 93 to the electrode 94c or the terminal 92. Under such a circumstance, there develops a space S between a tip portion of the capillary 95 and the electrode or the terminal, making impossible to properly bond the wire 93. As a result, according to the prior art, it is difficult to properly bond an end of the wire 93 to the electrodes 94a–94c or the terminal 92, and there is a significant risk of causing a faulty connection at the location where the wire is bonded.

DISCLOSURE OF THE INVENTION

It is therefore an object of the present invention to provide a semiconductor device of a chip-on-chip type which allows proper connection via wire between the electrodes in each of the semiconductor chips and respective terminals.

Another object of the present invention is to provide a semiconductor device of a chip-on-chip type which allows more appropriate connection between the electrodes in each of the semiconductor chips and corresponding terminals.

According to a first aspect of the present invention, there is provided a semiconductor device with a following arrangement. Specifically, the semiconductor device comprises a plurality of semiconductor chips stacked in the direction of thickness. Each of the semiconductor chips includes an upper surface formed with electrodes. The semiconductor device further comprises a plurality of terminal portions beside the semiconductor chips, and a plural pieces of wire for electrical connection from the electrodes to respective terminal portions. Further, each of the terminal portions is at an elevation lower than the highest electrodes, and higher than the lowest electrodes.

According to the above arrangement, it becomes possible to decrease the height difference between each of the electrode on the semiconductor chips and corresponding one of the terminal portions to be connected via the wire, even if there is a large height difference between the uppermost electrodes and the lowermost electrodes in the stack of plural semiconductor chips. Therefore, it becomes possible to properly connect all of the electrodes on each of the semiconductor chips to respective terminal portions by means of wirebonding, within the vertical moving range of the capillary of the wirebonding machine. Further, it becomes possible to press the capillary of the wirebonding machine to each of the electrodes and terminal portions at a smaller angle of tilt so that the wire can be tightly pressed against the surface of the electrode or terminal portion.

According to a preferred embodiment, the wire is bonded to the electrode as the first bonding, and thereafter to the terminal portion as the second bonding.

Further, according to the preferred embodiment, the plurality of semiconductor chips are mounted on a die-pad portion of a lead frame. The lead frame has internal lead portions formed beside the die-pad portion for serving as the terminal portions, and the die-pad portion is lower in elevation than the internal lead portion by a predetermined distance.

According to another preferred embodiment of the semiconductor device, the semiconductor device includes a first semiconductor chip disposed at a lower elevation and a second semiconductor chip disposed at a higher elevation. The first semiconductor chip and the second semiconductor chip are stacked via a plate type supporting member, and the plate type supporting member is formed with the plurality of terminal portions, as well as openings for the wire to communicate between the terminal portions and the electrodes of the first semiconductor chip for electrical connection.

The supporting member may be a film type substrate made of a thin film of synthetic resin formed with a conductive wiring region, a lead frame made of a metal, or a plate type substrate having a surface formed with a conductive wiring region.

According to the preferred embodiment, the first semiconductor chip and the second semiconductor chip are stacked to sandwich the plate type supporting member.

According to another preferred embodiment, the second semiconductor chip is smaller than the first semiconductor chip, and the two semiconductor chips being directly stacked together. Further, the second semiconductor chip and the electrodes of the first semiconductor chip face the opening, and the upper surface of the first semiconductor chip has its circumferential region bonded to a lower surface of the plate type supporting member.

It should be noted here that the second semiconductor chip may be stacked by another or a plurality of semiconductor chips other than the second semiconductor chip or the first semiconductor chip.

According to a second aspect of the present invention, there is provided a semiconductor device having a following arrangement. Specifically, the semiconductor device comprises a plurality of semiconductor chips stacked in the direction of thickness, and a plate type supporting member for supporting the plurality of semiconductor chips. The plate type supporting member is formed with terminal portions for electrical connection with the semiconductor chips. The plate type supporting member is at an intermediate elevation between an uppermost surface and a lowermost surface of the stack of semiconductor chips. The supporting member is a film type substrate made of a thin film of synthetic resin formed with a conductive wiring region, a lead frame made of a metal, or a plate type substrate having a surface formed with a conductive wiring region.

According to the above arrangement, it becomes possible to keep the height difference between the electrodes on each of the semiconductor chips and the terminal portions on the plate type supporting member corresponding not greater than a predetermined distance. Thus, connection can be properly made between the electrodes and the terminal portions by means of wirebonding. In addition, it becomes possible to further reduce the overall thickness of the semiconductor device. It should be noted however, that the electrical connection between the terminal portions on the supporting member and the electrodes on the semiconductor chips may not necessarily be by means of wirebonding. Alternatively for example, one or both of the electrodes and the terminal portions may be formed with bumps for press-fit bonding.

According to a preferred embodiment, the first semiconductor chip is stacked with the second semiconductor chip. The first semiconductor chip has a main surface formed with the electrodes and facing upward. Further, the supporting member is formed with an opening penetrating the supporting member in the direction of thickness so that the electrodes of the first semiconductor chip are not covered by the supporting member. With is arrangement, the terminal portions on the supporting member and the electrodes on the first semiconductor chip can be adequately connected by wirebonding.

According to another preferred embodiment, the supporting member is formed with a plurality of the above openings and a supporting region flanked by the openings. The first semiconductor chip and the second semiconductor chip are stacked to sandwich the supporting region. With this arrangement, the first and the second semiconductor chips can be advantageously supported by the plate type supporting member.

According to still another preferred embodiment, the second semiconductor chip is stacked so as not to cover the electrodes of the first semiconductor chip. Further, the second semiconductor chip has its main surface formed with the electrodes facing upward, and the electrodes of the first and second semiconductor chips are connected respectively to the terminal portions formed in the plate type supporting member via the wire.

According to still another preferred embodiment, the second semiconductor chip has the main surface facing downward, and is electrically connected to the first semiconductor chip. Further, one of the first semiconductor chip and the second semiconductor chip is electrically connected to the terminal portions formed in the plate type supporting member.

According to still another preferred embodiment, the terminal portions of the plate type supporting member extend into the opening. The electrodes of either the first semiconductor chip or the second semiconductor chip are connected to the extended terminal portions.

According to still another preferred embodiment, the first semiconductor chip and the second semiconductor chip are bonded to each other into the stack, and only one of the semiconductor chips is bonded to the supporting member.

According to still another preferred embodiment, the plate type supporting member is formed with an opening penetrating the supporting member in the direction of thickness. Further, the other of the first semiconductor chip and the second semiconductor chip is placed inside the opening while penetrating the opening vertically.

According to a third aspect of the present invention, there is provided a method for making a semiconductor device. The method for making this semiconductor device comprises a step of attaching a first semiconductor chip and a second semiconductor chip to a desired supporting member so that the first semiconductor chip is stacked by the second semiconductor chip. The supporting member includes an opening which penetrates the supporting member in the direction of thickness. The first semiconductor chip is fixed to a lower surface of the supporting member so that electrodes formed in the first semiconductor chip are faced to or exposed in the opening.

Other features and advantages of the present invention should become clearer from the detailed description to be made hereafter with reference to the attached drawings.

PREFERRED EMBODIMENTS

Preferred embodiments of the present invention will be described in specific details, referring to the accompanying drawings.

Referring first to FIGS. 1 through 10, the first aspect of the present invention will be described.

Figure 1:
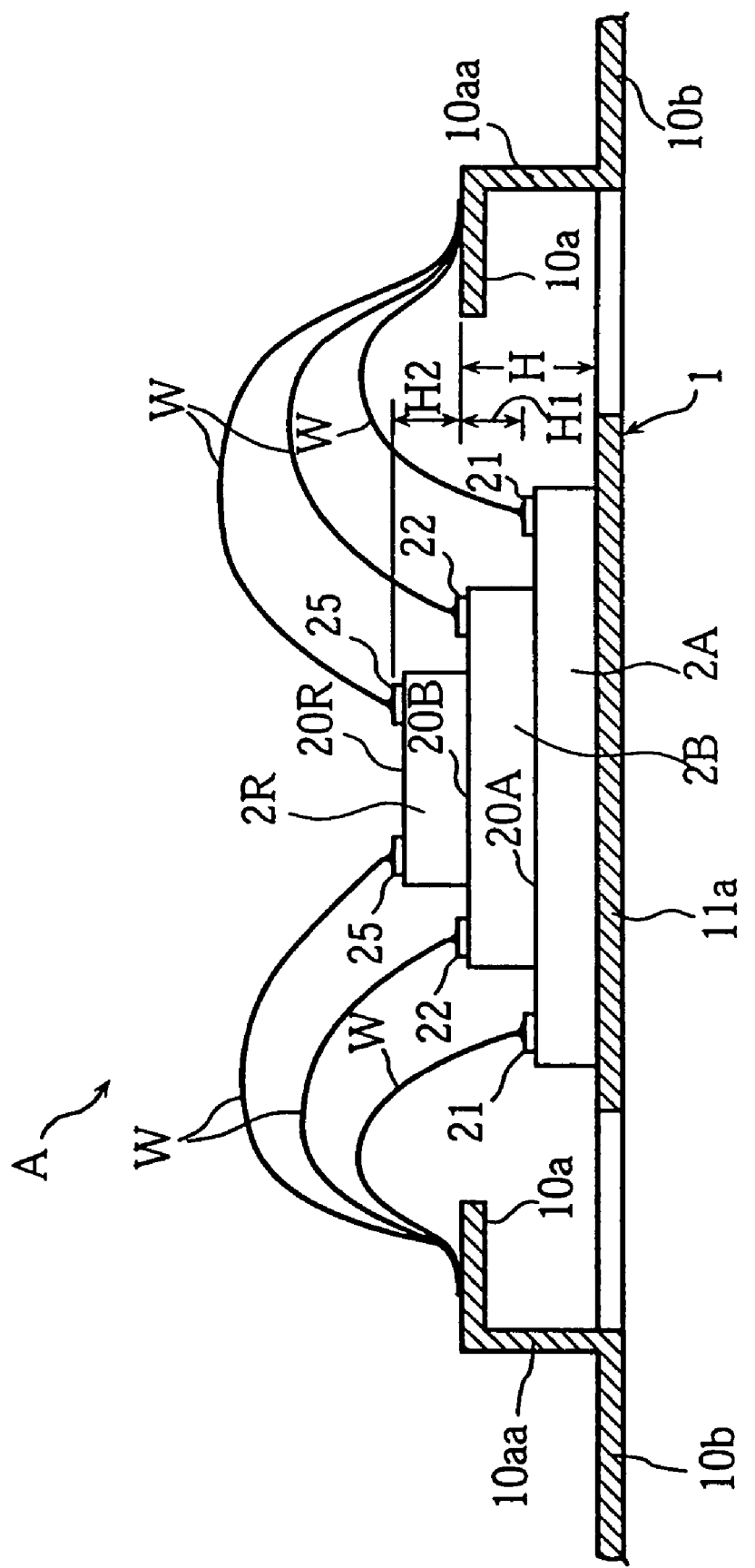
FIG. 1 is a sectional view showing a principal portion of an intermediate product of a semiconductor device as an embodiment of the present invention.
Figure 2:
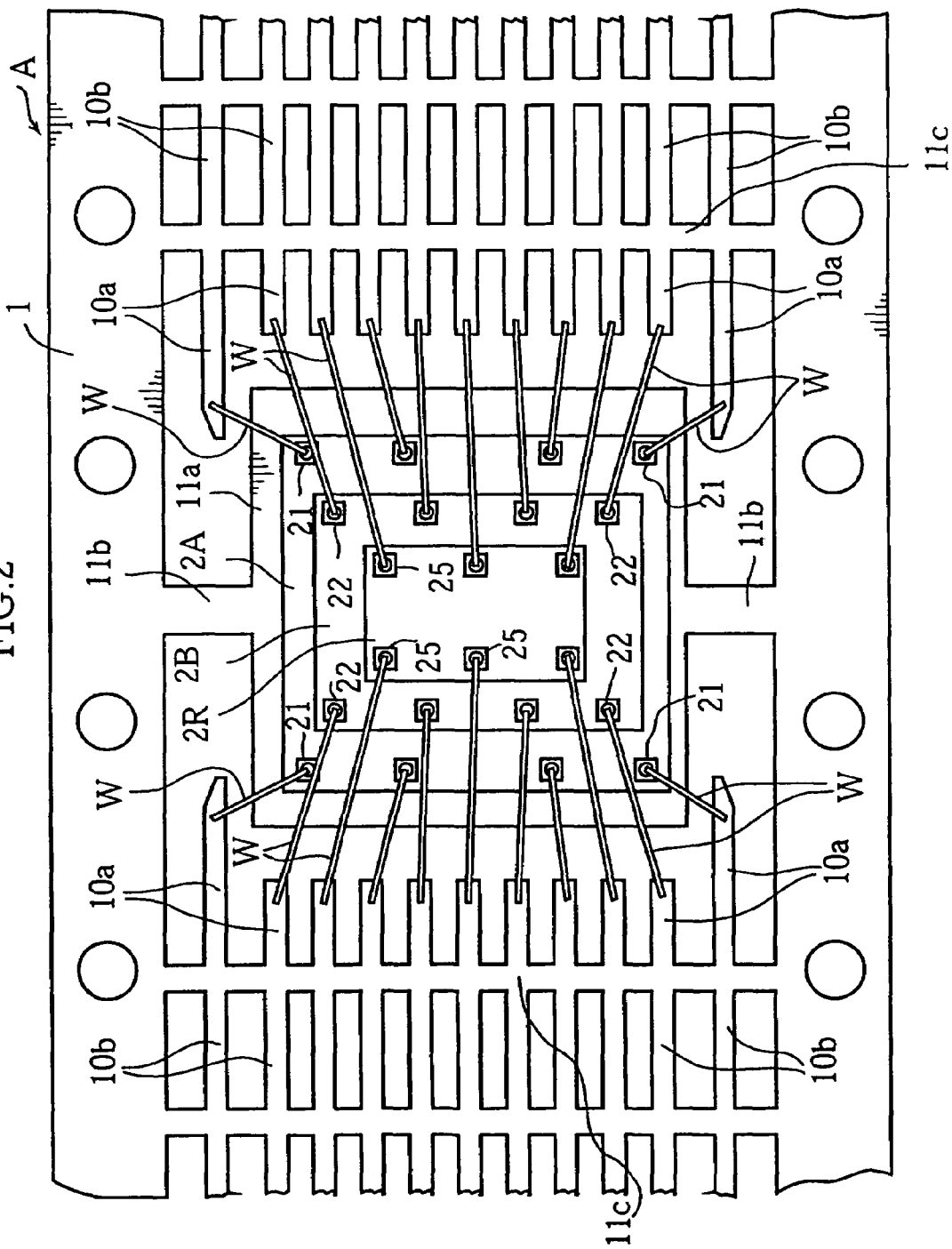
FIG. 2 is a plan view showing the principal portion in FIG. 1.

FIG. 1 is a sectional view showing a principal portion of an intermediate product A of a semiconductor device according to the present invention. FIG. 2 is a plan view of FIG. 1. The intermediate product A shown in these FIGS. 1 and 2 has an arrangement in which three semiconductor chips 2A, 2B, 2R are successively stacked one after another on a lead frame 1 in the direction of their thickness, and each of the three semiconductor chips 2A, 2B, 2R is connected to respective inner lead portions 10a of the lead frame 1 via a plural pieces of wire W. For convenience, the lowermost semiconductor chip 2A of the three semiconductor chips 2A, 2B, 2R will be called the first semiconductor chip herein. Likewise, the intermediate semiconductor chip 2B will be called the second semiconductor chip, and the uppermost semiconductor chip 2R will be called the third semiconductor chip.

Figure 3:
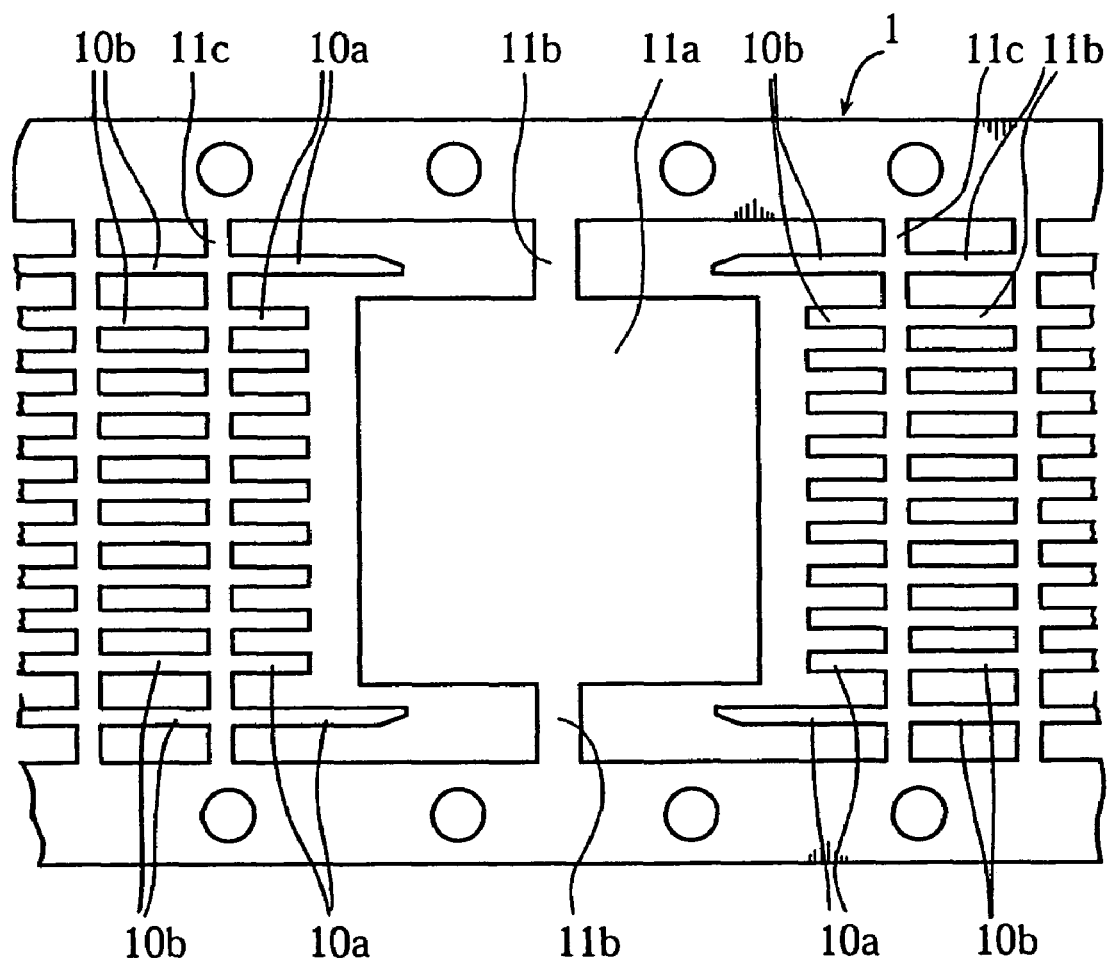
FIG. 3 is a plan view of a lead frame used in the intermediate product of the semiconductor device shown in FIGS. 1 and 2.

FIG. 3 is a plan view of the lead frame 1. This lead frame 1 is a long ribbon of a metal extending in one direction, and may be prepared by punching out a sheet of copper for example. The lead frame 1 is practically the same as a conventional lead frame commonly used in manufacturing of semiconductor devices, differing only in a point to be described later. Specifically, the lead frame 1 includes a plurality of die-pads 11a formed at a predetermined interval longitudinally of the lead frame. Each of the die-pads 11a is supported by support leads 11b, and accompanied by a plurality of internal lead portions 10a formed away from the die-pads 11a, and a plurality of external lead portions 10b connected to the internal lead portions 10a via tie-bars 11c.

The difference, however, is as clearly shown in FIG. 1, that each of the internal lead portions 10a has a base end portion 10aa bent upwardly to erect in such a way that the internal lead portion 10a, other than the base end portion 10aa, is higher by a predetermined height H than the rest of lead frame 1 including the die-pad 11a and the external lead portions 10b. Each of the internal lead portions 10a is a portion where an end of the wire W is to be bonded, and is an embodiment of the terminal portion according to the present invention.

Each of the three semiconductor chips 2A, 2B, 2R is an IC chip such as an LSI chip, where a predetermined electronic circuitry is integrated on a silicon chip. Each of the semiconductor chips 2A, 2B, 2R has respective main surface 20A, 20B, 20R formed with electrodes 21, 22, 25, and is held so that the main surface faces upward. The first semiconductor chip 2A has a surface facing away from the main surface 20A bonded by an adhesive to an upper surface of the die-pad 11a of the lead frame 1. The second semiconductor chip 2B is smaller in size than the first semiconductor chip 2A, and has a surface facing away from the main surface 20B bonded to a predetermined position in the main surface 20A of the first semiconductor chip 2A so as not to cover the electrodes 21 of the first semiconductor chip 2A. The third semiconductor chip 2R is smaller in size than the second semiconductor chip 2B, and has a surface away from the main surface 20R bonded to a predetermined position in the main surface 20B of the second semiconductor chip 2B so as not to cover the electrode 22 of the second semiconductor chip 2B.

The electrodes 21, 22, 25 respectively formed on the three semiconductor chips 2A, 2B, 2R, are resultingly located at three different heights, of low, middle, and high levels. However, each of the internal lead portions 10a is higher than the die-pad 11a. Because of this arrangement, according to the present embodiment, each of the internal lead portions 10a is made generally as high as the plurality of middle-level electrodes 22, i.e. being at an intermediate height between the plurality of lowest-level electrodes 21 and the plurality of the highest-level electrodes 25. It should be noted here that each of the electrodes 21, 22, 25 is made of aluminum for example, into a shape of pad suitable for wirebonding. More preferably, each of the aluminum electrodes 21, 22, 25 is plated by gold for improved electric conductivity with the wire W.

The wire W may be made of gold for example. In each of the plural pieces of wire W, an end is bonded to one of the plural electrodes 21, 22, 25 of the three semiconductor chips 2A, 2B, 2R, whereas the other end is bonded to a corresponding one of the internal lead portions 10a. The bond may be performed by means of thermosonic bonding method for example. The bonding of the wire to the electrodes 21, 22, 25, is made before the bonding to the internal lead portions 10a is made. Thus, the step of bonding to the electrodes is called the first bonding whereas the step of bonding to the internal lead portions 10a is called the second bonding.

As described earlier, the electrodes 21, 22, 25 are placed respectively at the three different levels of height. The middle-level electrodes 22 have a surface height generally the same as the surface height of the internal lead portions 10a. Therefore, when the wire W is bonded to the electrodes 22 and corresponding internal lead portions 10a, a capillary of a wirebonding machine can be lowered vertically or generally vertically to each surface of the electrodes 22 or the internal lead portions 10a. Thus, the wire W held by the capillary will be firmly pressed to the surface. As a result, it becomes possible to perform proper wirebonding in which each end of the wire W can be tightly contacted to the counterpart, providing each pair of the electrodes 22 and corresponding internal lead portions 10a with an appropriate wiring connection.

On the other hand, differing from the electrodes 22, the other two sets of the plural electrodes 21, 25 are located higher or lower than the internal lead portions 10a. However, since the internal lead portions 10a are located at the intermediate height between the two sets of electrodes 21, 25. Thus, it becomes possible to reduce height differences H1, H2. Specifically, each of the height differences H1 and H2 will be approximately a half of the height difference between the electrodes 21 and the electrodes 25. Therefore, when each end of the wire W is bonded, if a setting is made so that the capillary of the wirebonding machine will shift vertically from the height of internal lead portions 10a as a baseline, the capillary may be tilted only by a limited angle to each surface of the electrodes 21 and 25. Hence, it becomes possible to reduce the risk of making a faulty wirebonding resulting from the capillary tilted to a greater angle.

Figure 4:
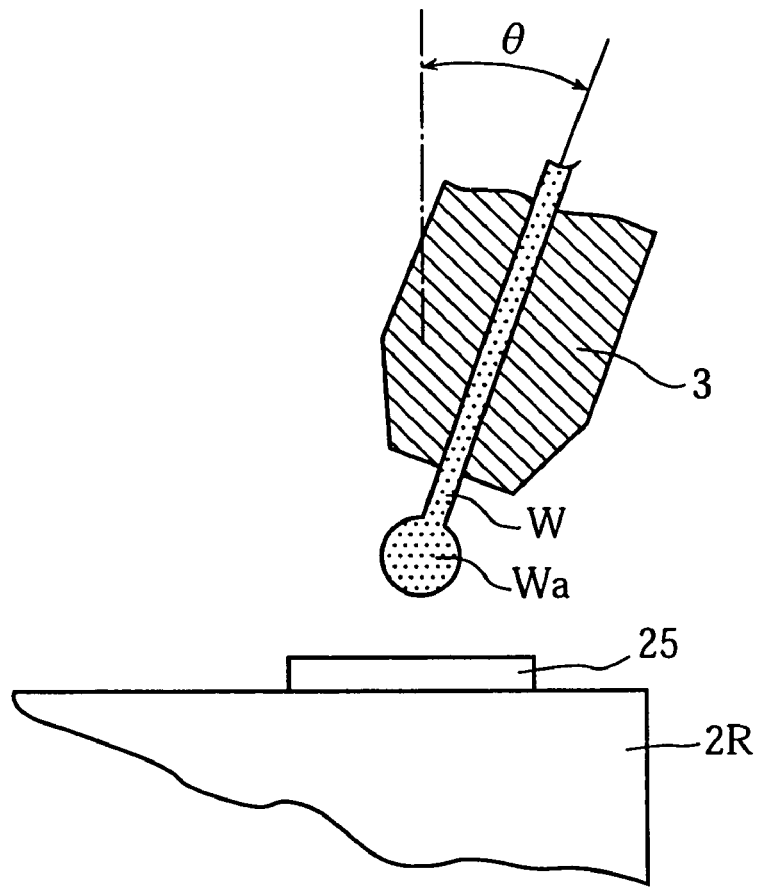
FIG. 4 is a sectional view of a principal portion showing a step of first bonding of a wire.
Figure 5:
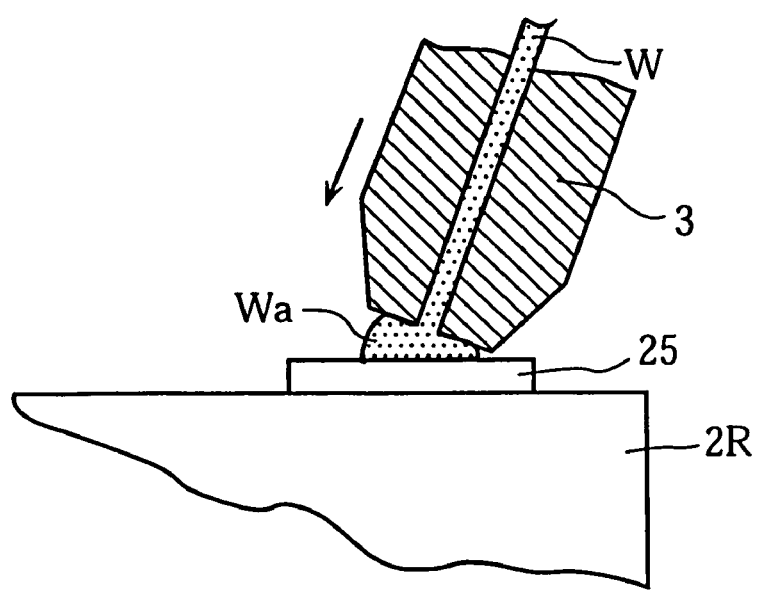
FIG. 5 is a sectional view of a principal portion showing another step of the first bonding of the wire.

Since the bonding of the wire to the electrodes 21, 22, 25 is performed as the first bonding, these electrodes and the internal lead portions 10a are further protected from possible faulty bonding of the wire W. Specifically, reference is now made to FIG. 4, taking an example of the first bonding in which an end of the wire W is to be bonded to the highest electrode 25. In this first bonding, the end of the wire W supported by the capillary 3 is first heated to make a gold ball Wa. Then, the gold ball Wa is pressed by a tip portion of the capillary 3 to the surface of the electrode 25. Since the gold ball Wa is molten and soft when pressed to the surface of the electrode 25, even if the capillary 3 is tilted by a limited angle θ to the vertical axis, it is still possible as shown in FIG. 5 to tightly press a bottom portion of the gold ball Wa to the surface of the electrode 25. Because the gold ball Wa is pressed to the bonding surface in the first bonding, the first bonding is more tolerant to the tilt of capillary than the second bonding to be described later. Hence, the wirebonding to the electrodes 25 can be performed even more appropriately. Needless to say, the same applies to the wirebonding to the other set of electrodes 21.

Figure 6:
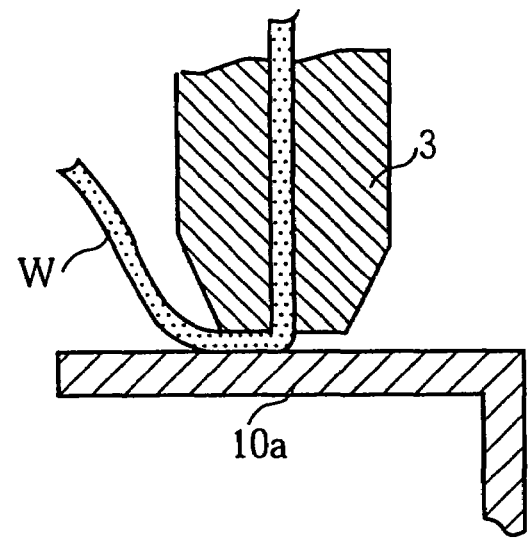
FIG. 6 is a sectional view of a principal portion showing a step of second bonding of the wire.

Next, the second bonding of the wire W to the internal lead portion 10a will be described referring to FIG. 6 as an example. In the second bonding, while the internal lead portion 10a is being heated, the wire W supported by the capillary 3 is pressed to the surface of internal lead portion 10a and ultrasonic wave is applied. In this second bonding, tolerance to the tilt of capillary 3 is relatively small. However, according to the present embodiment, the height of the internal lead portion 10a is the baseline height for the vertical movement of capillary 3, and therefore, it is possible to press the capillary 3 vertically or generally vertically to the surface of internal lead portion 10a. Since each of the internal lead portions 10a provided in the lead frame 10 has the same height, it is possible to properly perform the wirebonding to each of the internal lead portions 10a. As has been described thus far, according to the above arrangement, every point of wirebonding on the electrodes 21, 22, 25 of respective semiconductor chips 2A, 2B, 2R can be properly connected to respective internal lead portions 10a.

Figure 7:
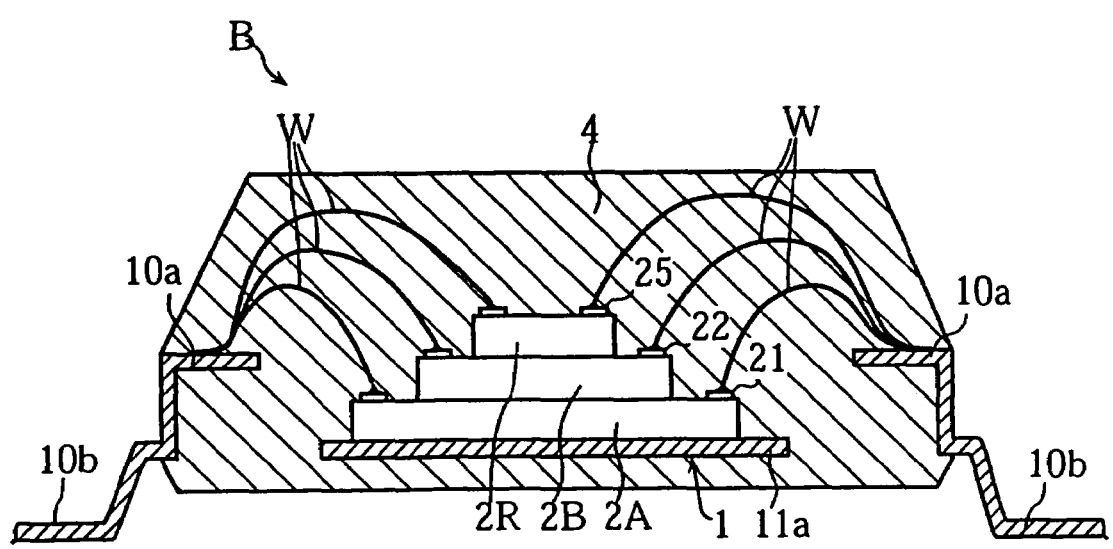
FIG. 7 is a sectional view of a semiconductor device manufactured from the intermediate product shown in FIGS. 1 and 2.

FIG. 7 is a sectional view showing a semiconductor device B manufactured from the intermediate product A shown in FIGS. 1 and 2.

The semiconductor device B shown in the figure can be obtained through production steps such as a resin packaging step. In this step the three semiconductor chips 2A, 2B, 2R and surrounding regions of the intermediate product A are filled by a molding resin 4. This is followed by a forming step of the lead frame 1. These operations are essentially the same as steps for manufacturing prior art semiconductor device from a prior art lead frame, and therefore will not be discussed in minute details here. The molding resin 4 sufficiently protects the main surfaces of the semiconductor chips 2A, 2B, 2R, conductors such as the wire W and other components. Each of the internal lead portions 10a connects corresponding one of the external lead portions 10b. The external lead potions serve as soldering terminals, and thus, the semiconductor device B can be applicable to surface mounting to a desired location.

Figure 8:
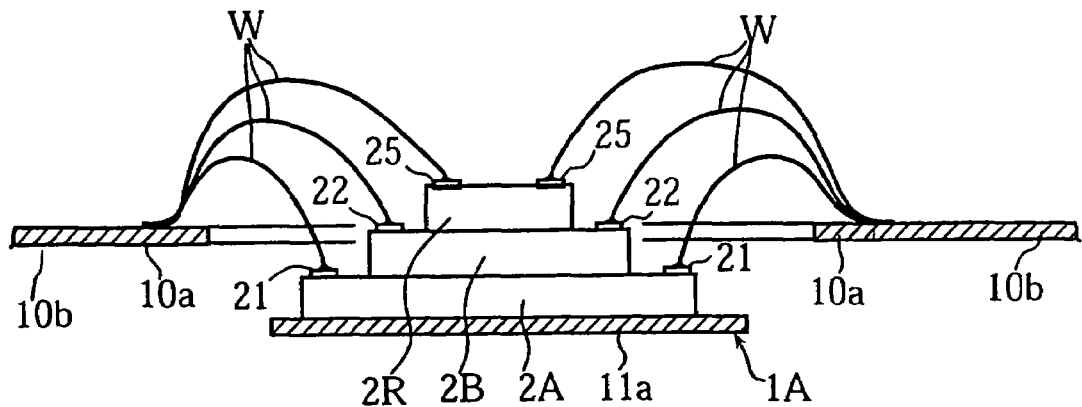
FIG. 8 is a view showing a semiconductor device according to another embodiment of the present invention.
Figure 9:
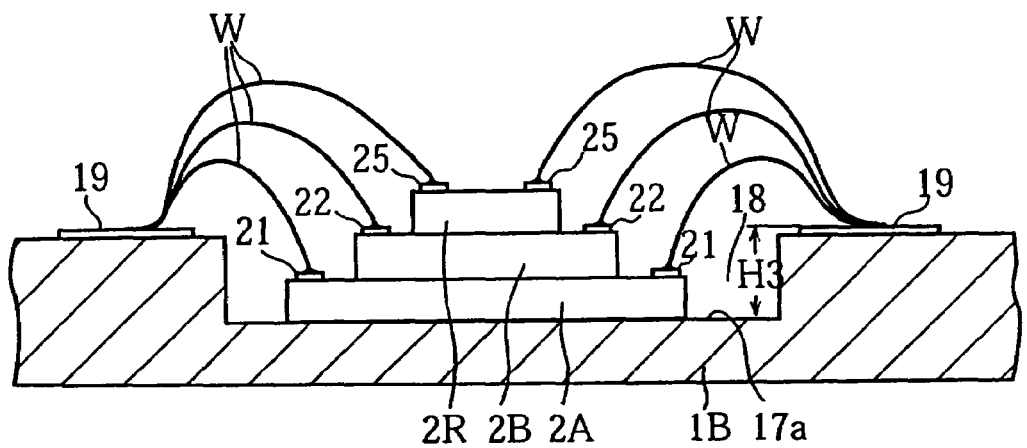
FIG. 9 is a view showing a semiconductor device according to still another embodiment of the present invention.
Figure 10:
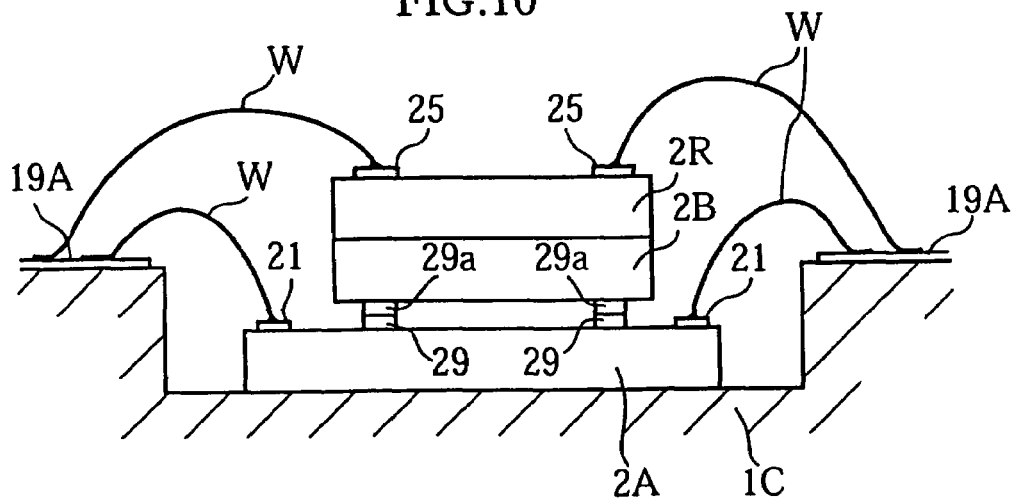
FIG. 10 is a view showing a semiconductor device according to still another embodiment of the present invention.

FIGS. 8 through 10 are sectional views showing a principal portion of other embodiments of the present invention. Each view represents a different embodiment from others.

FIG. 8 shows an arrangement, in which the three semiconductor chips 2A, 2B, 2R are mounted to the die-pad 11a of a lead frame 1A. In this arrangement, the die-pad is formed at a lower level than are other portions of the lead frame 1A such as the internal lead portions 10a and the external lead potions 10b. With this arrangement, the internal lead portions 10a, each serving as a terminal for bonding an end of the Wire W, can assume an intermediate height between the electrodes 21 and 22 of the semiconductor chips 2A, 2B. According to the above arrangement shown in FIG. 8, the die-pad of the lead frame is placed at a lower elevation. According to the previous embodiment shown in FIGS. 1 and 2, each of the internal lead portions of the lead frame is partially raised. Either one of the methods may be taken in order to make the internal lead portion higher than the die-pad.

FIG. 9 shows an arrangement, in which the three semiconductor chips 2A, 2B, 2R are mounted on a plate type substrate 1B of an appropriate thickness. Each of the electrodes 21, 22, 25 of the semiconductor chips 2A, 2B, 2R is connected via the wire W to a corresponding terminal portions 19 provided on the substrate 1B. The semiconductor chips 2A, 2B, 2R is placed in a recess 18 for example formed in the upper surface of the substrate 1B, so that there is a height difference H3 between the terminals 19 and the mounting surface 17a which receives the semiconductor chips 2A, 2B, 2R. Alternatively, regions of the substrate 1B where the terminals 19 are provided may be made higher than the rest of the regions in order to create the height difference H3 between the terminals 19 and the mounting surface 17a which receives the semiconductor chips 2A, 2B, 2R. According to the above arrangement, the height difference H3 allows the terminals 19 to be at an intermediate level between the electrodes 21, 25 of the semiconductor chips 2A, 2R.

As exemplified as above, the present invention is applicable not only to a case in which semiconductor chips are mounted to a lead frame, but also to a case in which mounting is made to a plate of substrate for example. The substrate may be not only of a hard material such as ceramic or synthetic resin, but also of a film type material. For example, a thin film of synthetic resin may be formed with wirebonding terminals made of a foil of copper.

FIG. 10 shows an arrangement, in which the three semiconductor chips 2A, 2B, 2R are stacked and mounted to a substrate 1C. The middle and the lower semiconductors 2A, 2B are mutually connected via bump electrodes 29, 29a. For this reason, only the electrodes 21, 25 of the lower and the upper semiconductor chips 2A, 2R are connected via the wire W to terminals 19A of the substrate 1C. The terminals 19A are provided at an intermediate height between the two sets of electrodes 21, 25. As will be understood from the above, according to the present invention, not all of the semiconductor chips stacked in the chip-on-chip style may be connected to terminals via the wire. Instead, some of the semiconductor chips in the stack may have direct electrical connection with each other.

Now, according to the above embodiments, the terminals are provided at an intermediate height between the electrodes of the uppermost and the lowermost semiconductor chips in the stack. These terminals are wirebonded to the electrodes on the semiconductor chips. This may be viewed form a different frame of reference that the stack of semiconductor chips is supported at an intermediate height between the uppermost surface and lowermost surface of the stack, and at the same time, disposed is the plate type supporting member provided with the terminals for electrical connection with the semiconductor chips. This view provides the second aspect of the present invention, which provides a common bases to many different embodiments of the semiconductor device according to the present invention to be described hereafter with reference to FIGS. 11 through 28.

Figure 11:
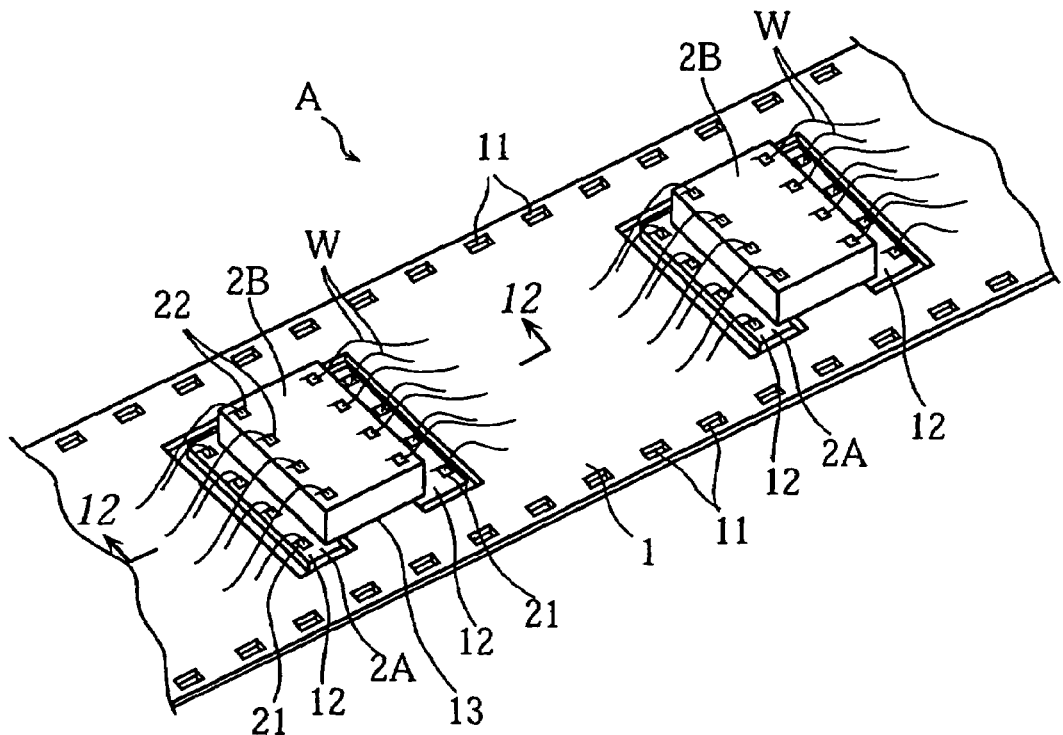
FIG. 11 is a perspective view sowing a principal portion of an intermediate product of still another semiconductor device according to the present invention.
Figure 12:
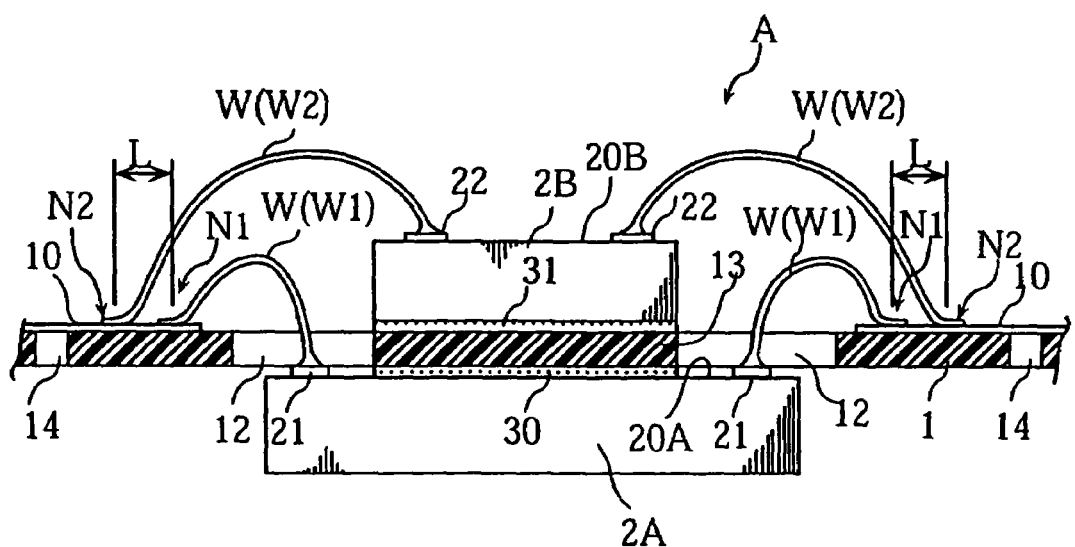
FIG. 12 is an enlarged sectional view taken along lines 12—12 in FIG. 11.

FIG. 11 is a perspective view showing a principal portion of an intermediate product of another semiconductor device according to the present invention. FIG. 12 is an enlarged sectional view taken in lines 12—12 in FIG. 11.

The arrangement to the intermediate product A shown in these FIGS. 11 and 12 is such that two semiconductor chips 2A, 2B are stacked one after the other in the direction of their thickness. The stack is supported by a substrate 1 serving as a plate type supporting member, and the two semiconductor chips 2A, 2B are connected via the wire W made of gold for example, to respective terminal portions 10 of the substrate 1. Again in this embodiment, the lower semiconductor chip 2A of the semiconductor chips 2A, 2B will be called the first semiconductor chip, whereas the upper semiconductor chip 2B will be called the second semiconductor chip.

The substrate 1 is a film type substrate based on a long ribbon of synthetic resin such as polyimide. The ribbon has two longitudinal edge portions formed with a plurality of holes 11 at an interval used for moving the substrate 1 along a predetermined path. The substrate 1 also has an upper surface provided with a conductive wiring region 10 (not shown in FIG. 11) which is formed with a plurality of wirebonding terminal portions each made of a foil of copper for example.

The substrate 1 is formed with openings 12, each of which is a through-hole having a rectangular opening and penetrating the substrate 1 in the direction of thickness. The openings 12 are provided in such a manner that two adjacent openings 12, 12 being away from each other by a predetermined distance La will serve as a pair. A plurality of pairs of the openings 12, 12 are provided at a predetermined longitudinal interval in the substrate 1 (See FIG. 13). In the present embodiment, a region sandwiched by the pair of openings 12, 12 is called a supporting region 13. A hole indicated by numeral code 14 in FIG. 12 is a through-hole used for establishing electrical connection between the conductive wiring region 10 and a predetermined ball of solder. This step of manufacturing a semiconductor device will be described later.

Each of the first semiconductor chip 2A and the second semiconductor chip 2B may be an LSI chip, for example, or another kind of IC chip in which a predetermined electronic circuitry is integrated on a silicon chip. The first semiconductor chip 2A has the main surface 20A which is a surface provided with the plurality of electrodes 21. Likewise, the second semiconductor chip 2B has the main surface 20B which is a surface provided with the plurality of electrodes 22. Each of the plural electrodes 21, 22 is formed as a relatively flat pad for facilitating the wirebonding. The pads may be made of aluminum for example, but more preferably should be gold-plated for better electric conductivity with the wire W.

The first semiconductor chip 2A is disposed on the lower surface of the substrate 1 in a manner that the main surface 20A faces upward. On the other hand, the second semiconductor chip 2B is disposed on the upper surface of the substrate 1 in a manner that the main surface faces upward. More specifically, the main surface 20A of the first semiconductor chip 2A has a widthwise center region not formed with any of the electrodes 21. This center region is bonded via a layer of adhesive 30 to the lower surface of the supporting region 13 of substrate 1. With this arrangement, each of the plural electrodes 21 of the first semiconductor chip 2A is exposed in or below the openings 12, 12. On the other hand, the second semiconductor chip 2B has a surface away from the main surface 20B bonded to the upper surface of the supporting region via a layer of adhesive 31. The second semiconductor chip 2B is smaller in width than the first semiconductor chip 2A, and is disposed so as not to cover the plural electrodes 21 of the first semiconductor chip 2A.

The intermediate product A can be obtained by a chip mounting operation to be described below.

Figure 13:
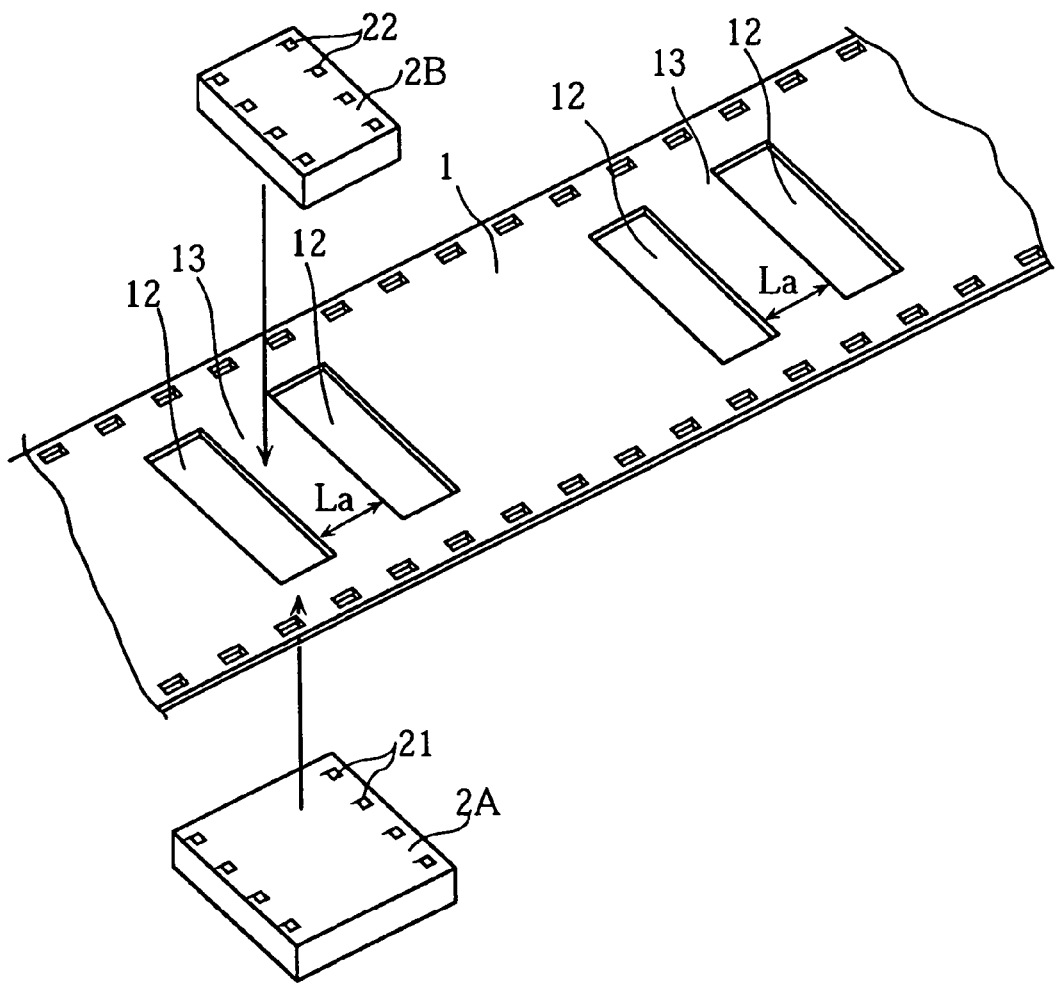
FIG. 13 is a perspective view showing a principal portion of a manufacturing step of the intermediate product shown in FIGS. 11 and 12.
Figure 14:
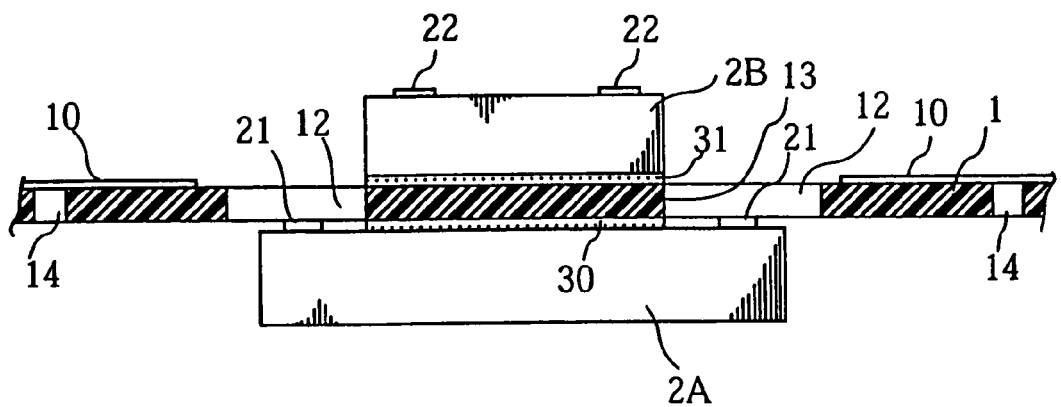
FIG. 14 is a perspective view showing a principal portion of another manufacturing step of the intermediate product shown in FIGS. 11 and 12.

First, as shown in FIG. 13, the substrate 1 provided with the plurality of openings 12 is prepared. It should be noted, however, that the forming of the openings 12 in the substrate 1 may be performed as a preparatory step of an integrated process before the two semiconductor chips 2A, 2B are mounted to the substrate 1 in actual mounting steps which are performed while the substrate 1 is being transferred. The openings 12 may be formed very easily by punching the substrate 1 for example, since each of the openings is a simple through-hole. Next to the punching, while the substrate is being moved, an adhesive is applied to the upper and lower surfaces of the supporting region 13. Then, a chip mounting machine places the second semiconductor chip 2B on the upper surface of the supporting region 13. The first semiconductor chip 2A is pressed to fit to the lower surface of the supporting region 13. In this cycle of operation, the two semiconductor chips 2A, 2B can be bonded to the substrate 1 in a stacked manner as shown in FIG. 4.

With the above arrangement, although the first semiconductor chip 2A is placed on the lower surface of the substrate 1, all of the plural electrodes 21 are placed below the opening 12, and are exposed without being covered by the substrate 1. Therefore, it is possible as shown in FIG. 12, to make proper electric connections by the wire W between the electrodes 21 of the first semiconductor chip 2A and the conductive wiring region 10 of the substrate 1. Each of the electrodes 21 is only slightly below the upper surface of the substrate 1. Thus, the bonding of the wire W for connecting each of the electrodes 21 to the conductive wiring region 10 can be properly performed by a conventional wirebonding machine.

On the other hand, the second semiconductor chip 2B is virtually in the same condition as being mounted on the upper surface of the substrate 1. Therefore, the distance from the upper surface of the substrate 1 to the electrodes 22 is generally identical with the thickness of the second semiconductor chip 2B. As a result, the bonding of the wire W for connecting each of the electrodes 22 to the conductive wiring region 10 can also be performed properly by a conventional wirebonding machine.

According to the above arrangement, the wirebonding to the substrate 1 is made at an intermediate height between the height of electrodes 21 of the semiconductor chip 2A and that of the electrodes 22 of the semiconductor chip 2B. If the height of the bonding to the substrate 1 is selected to be the baseline height, then neither of the electrodes 21 and 22 of the two semiconductor chips 2A, 2B will be too far away from the baseline height. This makes possible to prevent the capillary of the bonding machine from being excessively tilted when performing the wirebonding to the electrodes 21, 22 of the two semiconductor chips. Instead, the capillary can be pressed generally vertically to the face of contact on the electrodes 21, 22, allowing proper wirebonding which provides good electrical connection.

Further, according to the above arrangement, an overall thickness of the two semiconductor chips 2A, 2b after mounting is generally equal to the sum of the thickness of each of the two semiconductor chips added with the thickness of the substrate 1. Thus, if the thickness of the substrate 1 is small, the arrangement is optimal for minimizing the total thickness of the device. Further, the two semiconductor chips 2A, 2B are bonded to the supporting region 13 of the substrate 1, vertically sandwiching the supporting region 13. Thus, bonding strength to the substrate 1 can be easily increased.

Still further, according to the present embodiment, an arrangement is made so that bonding of the plural pieces of wire W to the conductive wiring region 10 of the substrate 1 is made along a zigzag path as viewed from above. More specifically, as clearly shown in FIG. 12, the electrode 21 of the first semiconductor chip 2A is bonded with one end of the wire W (W1), whereas the other end is to be bonded to a bonding location N1 on the conductive wiring region 10. The electrode 22 of the second semiconductor chip 2B is bonded with one end of the wire W (W2), whereas the other end is to be bonded to a bonding location N2 on the conductive wiring region 10. The two bonding locations are apart from each other by an appropriate distance L in the direction in which the wire W is laid, so that the bonding location N2 is farther from the semiconductor chips 2A, 2B than is the other bonding location N1.

If the plural pieces of wire W are bonded according to the above arrangement, bonding pitch of the wires W on the conductive wiring region 10 can be practically increased. This provides an advantage of reduced risk of short circuit between adjacent bonds on the conductive wiring region 10. Another advantage is that the two pieces of wire W1 and W2 will not cross each other as viewed from the side as shown in FIG. 12. This is preferable in preventing a short circuit resulting from mutual contact of the wire W.

In manufacturing a chip-on-chip type product, a plurality of semiconductor chips must be wirebonded to a conductive wiring region on a substrate. Often, many pieces of wire have to be bonded at a very small pitch. The above described wirebonding arrangement according to the present embodiment can advantageously prohibit these pieces of wire from unduly coming contact with each other. Alternatively, the entire surface of the wire may be coated by an insulating material such as polyethylene. This prevents electric short circuit even if the wire is contacted by another.

Next, description will be made for a method of manufacturing a final semiconductor device from the above intermediate product A, and an arrangement for the semiconductor device.

Figure 15:
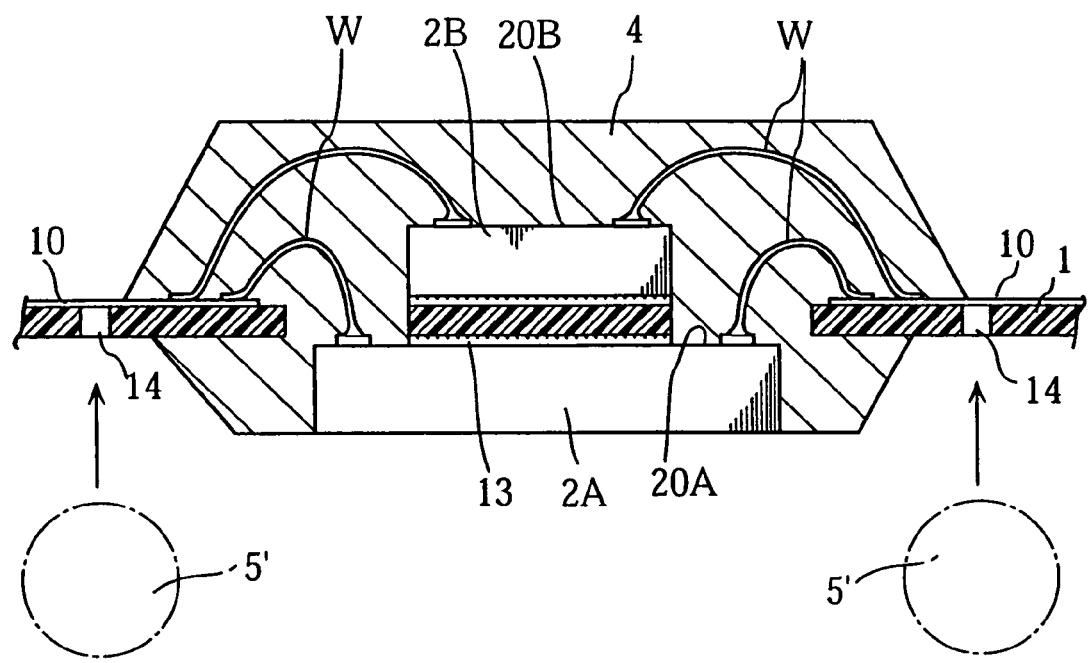
FIG. 15 is a sectional view of a principal portion showing a step of manufacturing a semiconductor device from the intermediate product shown in FIGS. 11 and 12.
Figure 16:
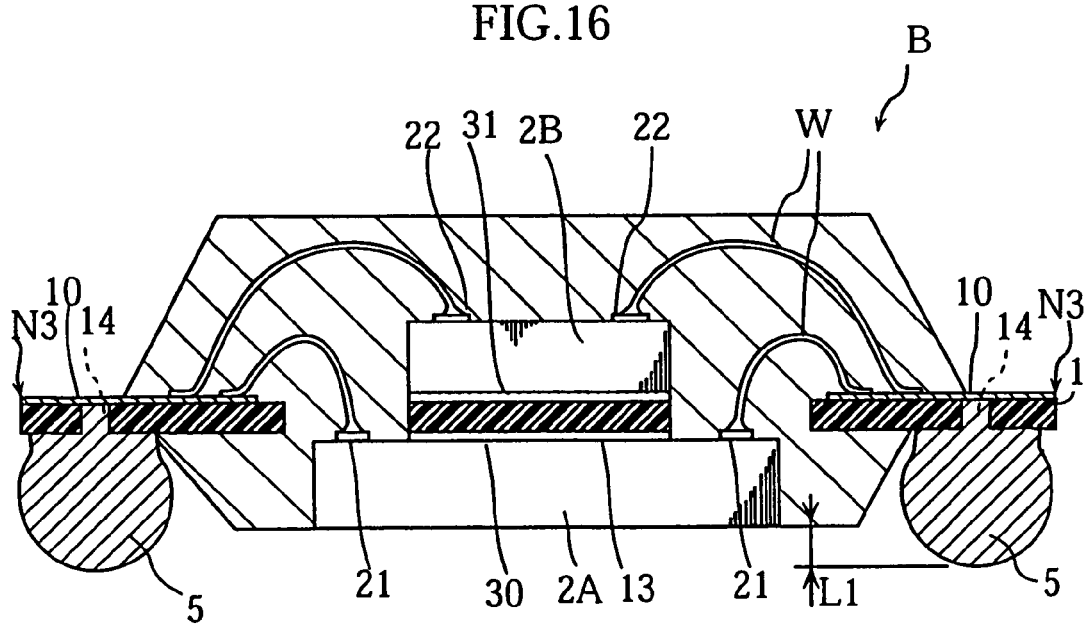
FIG. 16 is a sectional view showing a principal portion of an arrangement to the semiconductor device manufactured from the intermediate product shown in FIGS. 11 and 12.

FIG. 15 is a sectional view of a principal portion showing a step of manufacturing the semiconductor device from the above intermediate product A. FIG. 16 is a sectional view of a principal portion showing the arrangement for the semiconductor device B as a final product.

As shown in FIG. 15, the first step for manufacturing the semiconductor device B from the intermediate product A is resin packaging. In this step the two semiconductor chips 2A, 2B and a surrounding region is filled by a molding resin 4. This resin packaging step can be performed continuously by using a transfer molding method while the long ribbon of substrate 1 is being moved longitudinally thereof across a set of resin molding dies. The molding resin 4 may be a thermosetting epoxy resin for example. This resin packaging step seals the main surfaces 20A, 20B of the two semiconductor chips 2A, 2B, the wire W, wirebonded connections of the wire W and a surrounding region into a mass of the resin for protection.

Next, as shown by phantom lines in FIG. 15, a plurality of solder balls 5' are bonded to respective openings of the plurality of holes 14 formed in the lower surface of the substrate 1. The bonding of the solder balls 5' may be achieved by using an adhesive for example. It should be noted that each of the plural holes 14 communicates with the conductive wiring region 10 of the substrate 1 disposed above the openings. After the plurality of solder balls 5' are attached, the intermediate product is moved into a heating furnace to melt and then solidify the plurality of solder balls 5'.

In the above step, as shown in FIG. 16, the plurality of solder balls 5' form a plurality of projecting terminals 5. During the heating process, part of the molten solder ball 5' flows into the hole 14, making each of these terminals 5 electrically connected to the conductive wiring region 10 of the substrate 1. Each of the terminals is generally global due to the surface tension of the solder, with the bottom of the ball slightly below the lower surface of the first semiconductor chip 2A by an appropriate distance L1. After the terminals 5 are formed, the long ribbon of the substrate 1 is cut along appropriate lines N3, N3 off the outer edge of each terminal 5. In this cutting operation, individual semiconductor devices B are separated from a long ribbon of the substrate 1, and a large number of the semiconductor devices B can be continuously produced.

When mounted to a desired circuit board for example, the above semiconductor device B is ready for surface mounting by means of re-flow soldering. Specifically, the plurality of the terminals 5 of the semiconductor device B is made of solder, and therefore, the semiconductor device B may simply be lowered onto the desired circuit board, and then the entire circuit board may be placed in a furnace for heating. This allows the terminals 5 to melt and bond to corresponding terminals on the circuit board, establishing proper electrical connection. In this way, the surface mounting of the semiconductor device B can be achieved very easily.

Figure 17:
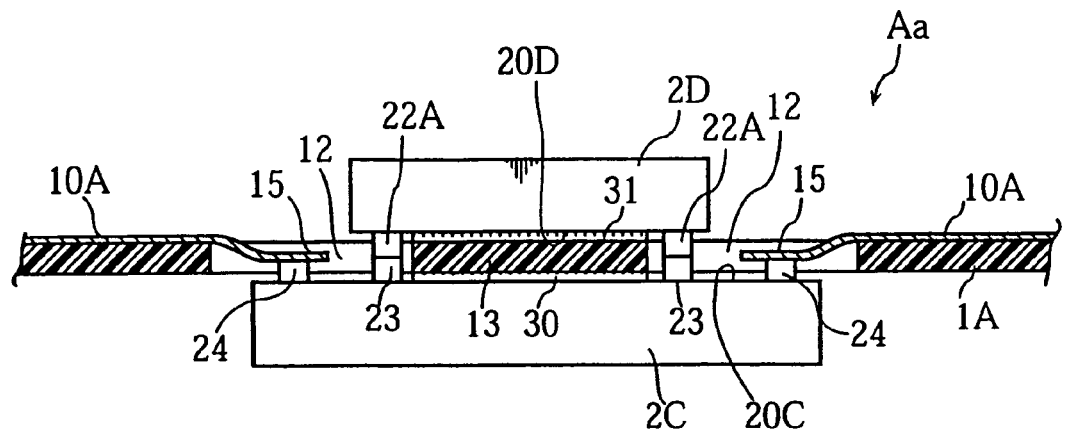
FIG. 17 is a sectional view showing a principal portion of an intermediate product of still another semiconductor device according to the present invention.

FIG. 17 is a sectional view showing an intermediate product of another semiconductor device according to the present invention. It should be noted that in FIG. 17 and each of the figures thereafter, components identical with those already shown in FIGS. 11 through 14 will be indicated by the same alpha-numerical code, and no detailed description will be given.

FIG. 17 shows an intermediate product Aa, in which a first semiconductor chip 2C and a second semiconductor chip 2D are not wirebonded to the conductive wiring region 10 of the supporting substrate 1A. Instead, the connections are made by so called TAB (Tape Automated Bonding) method. More specifically, the second semiconductor chip 2D is placed with its main surface 20D facing downward, and is bonded via a layer of adhesive 31 to the upper surface of the supporting region 13 of the substrate 1A. The main surface 20D is provided with a plurality of bump type electrodes 22A each projecting downward. On the other hand the first semiconductor chip 2C is bonded via a layer of adhesive 30 to the lower surface of the supporting region 13, with its main surface 20C facing upward. The main surface 20C is provided with a plurality of bump type first electrodes 23 and a plurality of bump type second electrodes 24. The first electrodes 23 are respectively connected to the electrodes 22A of the second semiconductor chip 2D whereas the second electrodes 24 are respectively connected to terminal portions 15 of the substrate 1A. Each of the terminal portions 15 of the substrate 1A is made of a relatively thick and hard conductive material such as copper. The copper is connected to the conductive wiring region 10 provided in the surface of substrate 1A, and is cantilevered to extended inwardly of the opening 12. The connection between the terminal portions 15 and the second electrodes 24, and the connection between the first electrodes 23 and the electrodes 22A may be made very easily. Specifically, anisotropic conductive film or anisotropic conductive adhesive is placed between a pair to be connected, and then the pair is pressed against each other while being heated. It should be appreciated that the anisotropic conductive film or anisotropic conductive adhesive is a film or an adhesive made of an insulating material dispersed with electrically conductive particles. When pressurized by a bump electrode for example, the portion of the film or the adhesive under the pressure becomes conductive.

According to the intermediate product Aa with the above arrangement, the first semiconductor chip 2C is connected to the substrate 1A via the second electrodes 24. In addition, the second semiconductor chip 2D is connected to the terminal portions 15 of the substrate 1A via the electrodes 22A, the first electrodes 23, internal wiring of the first semiconductor chip 2C, and the second electrodes 24. As will be understood from the above, according to the present invention, wire connection between the substrate and the semiconductor chips is not always necessary. Instead, such an arrangement as made in the intermediate product Aa according to the present embodiment may be made for the semiconductor chips to be electrically connected to a predetermined position of the substrate. According to the intermediate product Aa, the first semiconductor chip 2C and the second semiconductor chip 2D are electrically connected with each other. With such an arrangement, only the first semiconductor chip should be electrically connected to the substrate 1A. Since there is no need for both of the two semiconductor chips 2C, 2D to be directly connected to the substrate 1A, manufacturing operation of electrically connecting the semiconductor chips to the substrate 1A can become more efficient.

Figure 18:
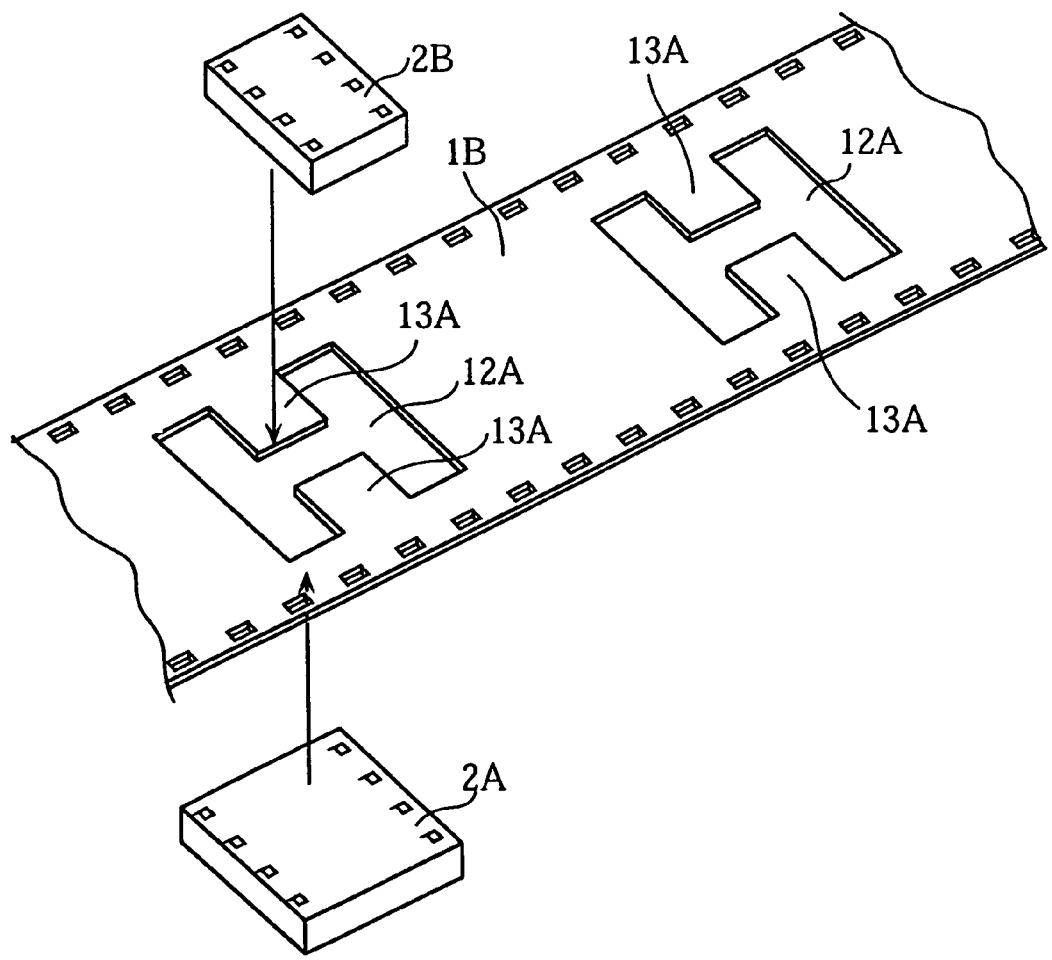
FIG. 18 is an explosive view showing a principal portion of an intermediate product of still another semiconductor device according to the present invention.

FIG. 18 is an explosive perspective view showing still another embodiment of the semiconductor device according to the present invention.

According to an arrangement shown in the figure, a film type substrate 1B is formed with an opening 12A which is generally H-shaped as viewed from above. The opening 12A leaves a pair of supporting regions 13A, 13A each extending inwardly of the opening 12A. These supporting regions 13A, 13A are practically two end portions of the supporting region 13 shown in FIG. 17, with the longitudinally central portion of the supporting region 13 removed to divide the region into two.

When the substrate 1B is mounted with the first semiconductor chip 2A and the second semiconductor chip 2B, the first semiconductor chip 2A and the second semiconductor chip 2B are respectively bonded to the lower and the upper surfaces of the supporting regions 13A, 13A so that the supporting regions 13A, 13A may be sandwiched from above and below. Thus, with the use of the substrate 1B, each of the two semiconductor chips 2A, 2B can be bonded to the substrate as securely and firmly as in the embodiments shown in FIGS. 11 and 12. The opening 12A which forms the supporting regions 13A, 13A may be easily made in the substrate 1B by a punching method using a punching die having the H-shape. It should be noted that one of the pair of supporting regions 13A, 13A may be removed for example, so that only one supporting region extends into the opening 12A. No particular number of the supporting regions need to be specified.

Figure 19:
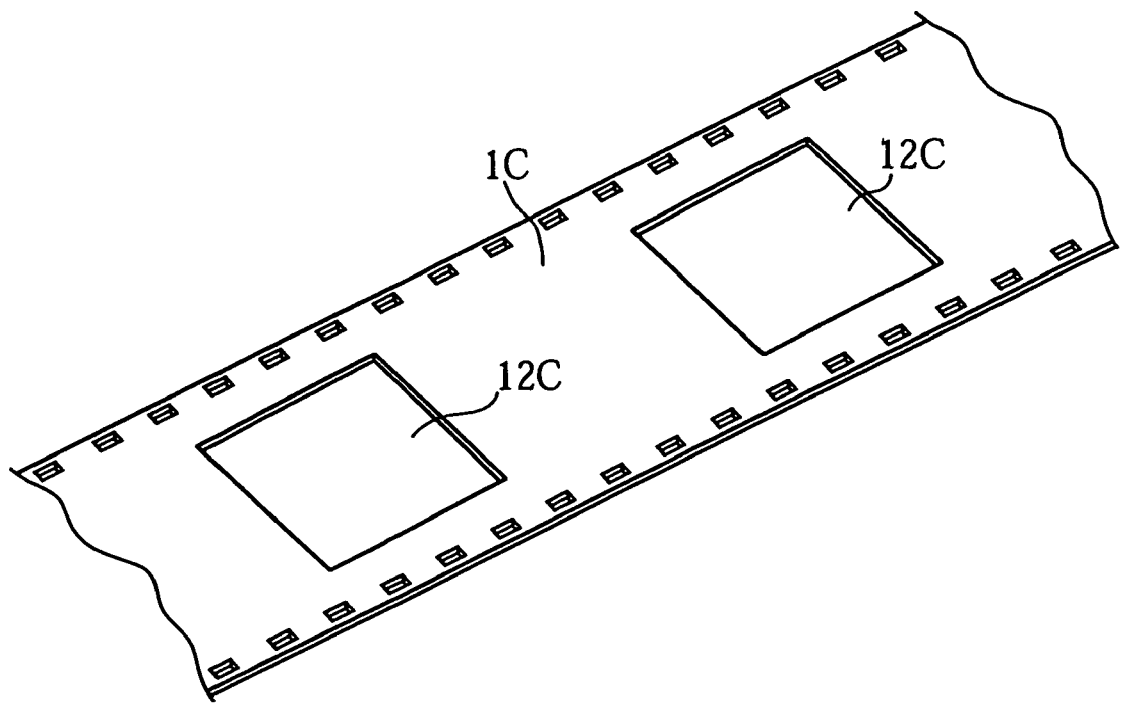
FIG. 19 is a perspective view showing a principal portion of a substrate for still another semiconductor device according to the present invention.
Figure 20:
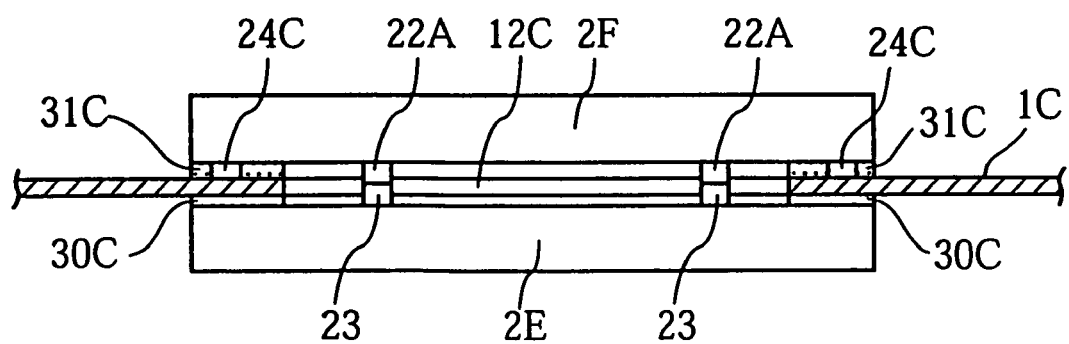
FIG. 20 is a sectional view showing a principal portion of an intermediate product of the semiconductor device manufactured from the substrate shown in FIG. 19.

FIG. 19. is a perspective view showing a principal portion of another substrate. FIG. 20 is a sectional view showing a principal portion of another semiconductor device manufactured from the substrate shown in FIG. 19.

The substrate 1C shown in FIG. 19 is formed with a plurality of openings 12C each having, for example, a generally rectangular shape as viewed from above. According to the semiconductor device shown in FIG. 20, the substrate 1C is sandwiched from above and below, around a circumferential region of the opening 12. Specifically, the first semiconductor chip 2E is bonded via a layer of adhesive 30C to the lower surface around the circumference of the opening 12C. Likewise, the second semiconductor chip 2F is bonded via a layer of adhesive 31C to the upper surface around the circumference. It should be noted that according to the arrangement shown in FIG. 20, a first semiconductor chip 2E and a second semiconductor chip 2F are connected to each other via bump electrodes 23, 22A, whereas the second semiconductor chip 2F is also connected via another set of bump electrodes 24C to predetermined positions of the substrate 1C. Thus, each of the two semiconductor chips 2E, 2F is electrically connected to the predetermined positions of the substrate 1C without relying on wirebonding. If the layer of adhesive 31C is formed by an anisotropic conductive adhesive for example, it becomes possible to simultaneously perform the bonding of the second semiconductor chip 2F to the substrate 1C, and the connecting of the electrode 24C to the predetermined position on the substrate 1C.

Figure 21:
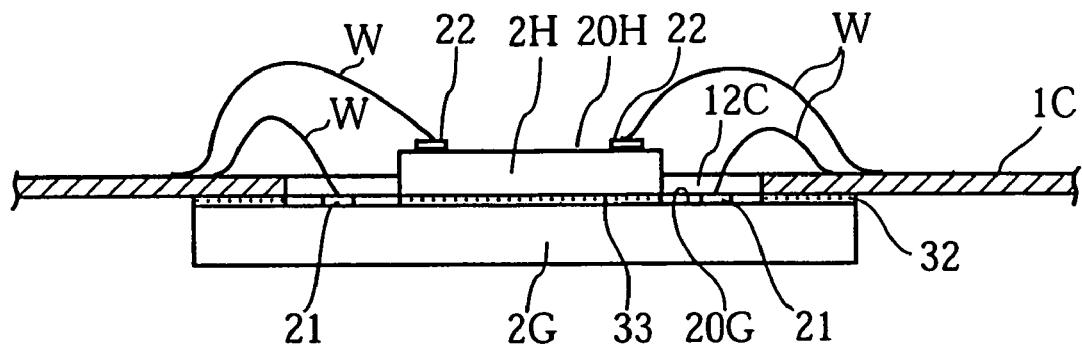
FIG. 21 is a sectional view showing a principal portion of an intermediate product of still another semiconductor device according to the present invention.

FIG. 21 is a sectional view showing a principal portion of still another embodiment of the semiconductor device according to the present invention.

According to this arrangement shown in FIG. 21, a first semiconductor chip 2G is bonded via a layer of adhesive 32 to the lower surface of the substrate 1C around a circumference of the opening 12C. The electrodes 21 of this first semiconductor chip 2G are exposed in the opening 12C. On the other hand, a second semiconductor chip 2H has a main surface 20H facing upward, and has a lower surface bonded to the main surface 20H of the first semiconductor chip 2G via a layer of adhesive 33. The two semiconductor chips 2G, 2H respectively have pluralities of electrodes 21, 22, each connected via wire W to a predetermined position in the upper surface of the substrate 1C. According to the arrangement shown in this FIG. 21, the second semiconductor chip 2H is not directly bonded to the substrate 1C. However, this second semiconductor chip 2H is bonded to the first semiconductor chip 2G which is properly bonded to the substrate 1C. Thus, the second semiconductor chip is properly positioned on the substrate 1C.

Figure 22:
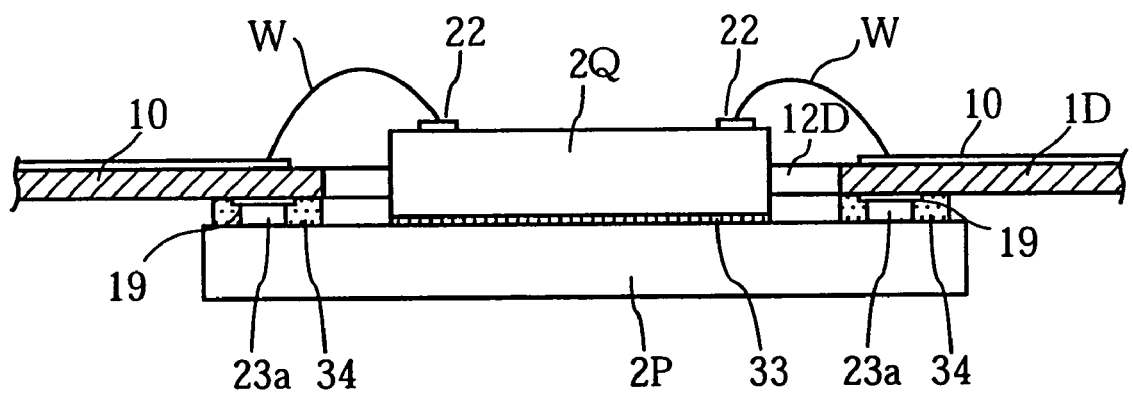
FIG. 22 is a sectional view showing a principal portion of an intermediate product of still another semiconductor device according to the present invention.
Figure 23:
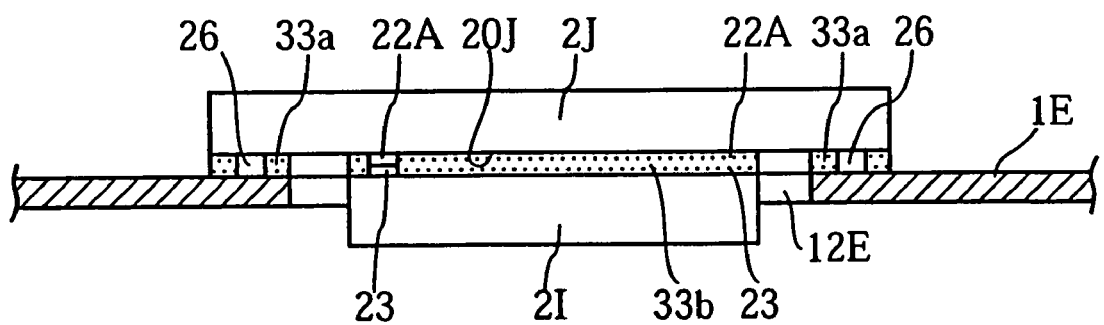
FIG. 23 is a sectional view showing a principal portion of an intermediate product of still another semiconductor device according to the present invention.

FIGS. 22 and 23 are sectional views each showing a principal portion of still another semiconductor device according to the present invention.

FIG. 22 shows an arrangement, in which a first semiconductor chip 2P is bonded via a layer of adhesive 34 to the lower surface of a substrate 1D. However, electrodes 23a of this first semiconductor chip 2P are not exposed in a through-hole opening 12D of the substrate 1D. On the other hand, the lower surface of the substrate 1D has locations respectably facing the electrodes 23a, and connected via a through-hole (not shown) to the conductive wiring region 10 on the upper surface of the substrate 1D. A second semiconductor chip 2Q is bonded to the upper surface of the first semiconductor chip 2P by the layer of adhesive 33, and is placed inside of the opening 12D. The electrodes 22 of this second semiconductor chip 2Q are connected via wire W to the conductive wiring region 10 of the substrate 1D.

According to the arrangement shown in FIG. 22, the electrodes 23a of the first semiconductor chip 2P are not exposed in the opening 23D, and the upper surfaces of the electrodes 23a are covered by the substrate 1D. However, the electrodes 23a can be appropriately connected to the terminals 19 provided in the lower surface of the substrate 1D. On the other hand, according to the above arrangement, since the second semiconductor chip 2Q is disposed in the opening 12D, it becomes possible to reduce the overall thickness of the portion where these two semiconductor chips 2P, 2Q are mounted.

Reference is now made to FIG. 23. Conversely to the arrangement shown in FIG. 22, a first semiconductor chip 2I is disposed in an opening 12E of a substrate 1E. A second semiconductor chip 2J is bonded via a layer of adhesive 33a to the upper surface of the substrate 1E. The second semiconductor chip 2J has a main surface 20J facing downward, and its first electrodes 26 connected to respective predetermined locations in the substrate 1E. Further, the first semiconductor chip 2I and the second semiconductor chip 2J are connected to each other via a layer of adhesive 33b. The electrodes 23 of the first semiconductor chip 2I and the second electrodes 22A of the second semiconductor chip 2J are connected to each other.

According to the arrangement shown in FIG. 23, the first semiconductor chip 2I is disposed inside the opening 2E. Thus, similarly to the arrangement shown in FIG. 22, it becomes possible to reduce the overall thickness of the portion where the two semiconductor chips are mounted. It should be noted here that if he overall thickness is to be reduced by placing a semiconductor chip inside the opening, whichever of the first semiconductor chip and the second semiconductor chip of the stack may be placed inside the opening.

Figure 24:
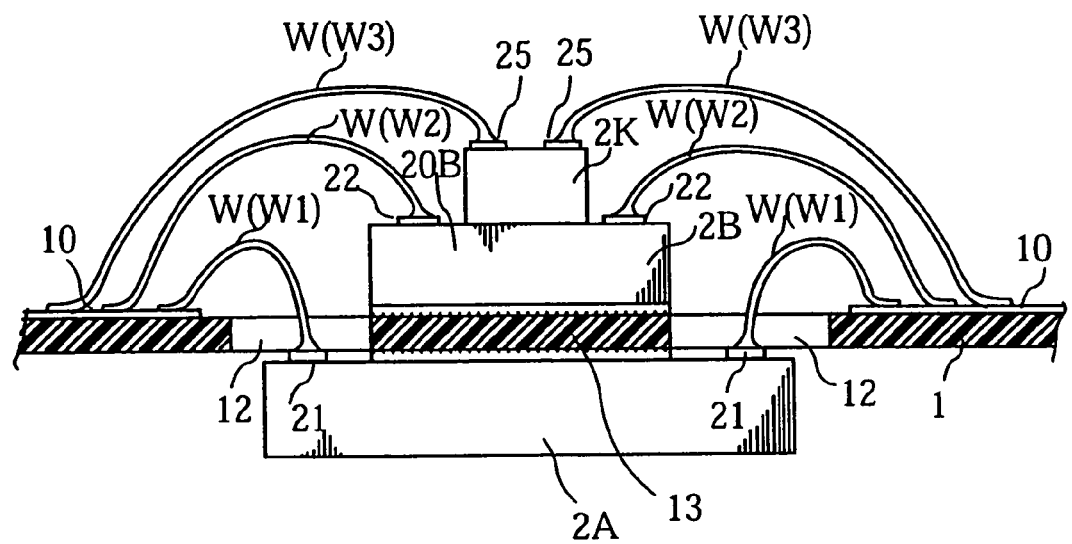
FIG. 24 is a sectional view showing a principal portion of an intermediate product of still another semiconductor device according to the present invention.
Figure 25:
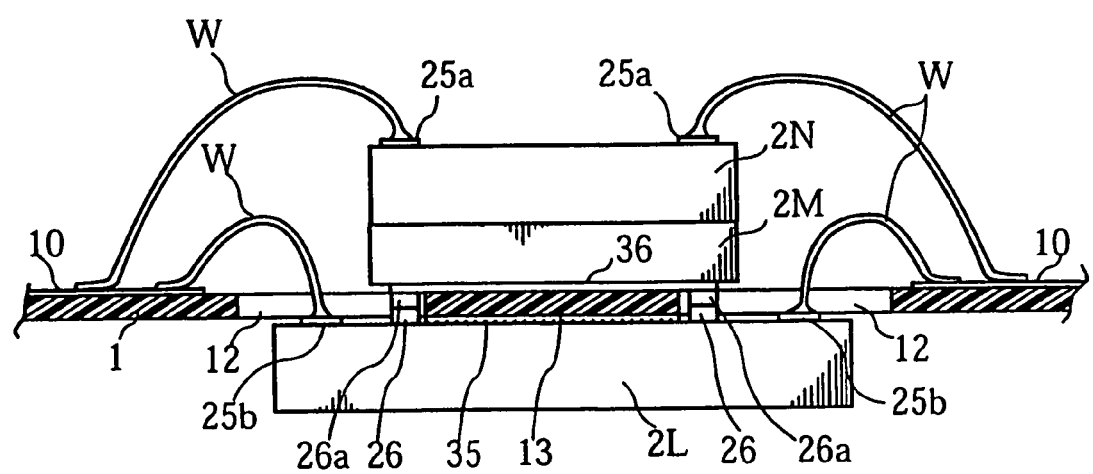
FIG. 25 is a sectional view showing a principal portion of an intermediate product of still another semiconductor device according to the present invention.

FIGS. 24 and 25 are sectional views each showing a principal portion of still another semiconductor device according to the present invention.

Each of these figures show an arrangement in which a total of three semiconductor chips are stacked. Specifically, the arrangement shown in FIG. 24 is the arrangement shown in FIGS. 11 and 12, differing in that the second semiconductor chip 2B is bonded, on its main surface 20B, with a third semiconductor chip 2K, and the electrodes 25 of this third semiconductor chip 2K are connected via wire to terminal pads of the conductive wiring region 10 of the substrate 1. FIG. 25 show the other arrangement, in which a first semiconductor chip 2L is bonded via a layer of adhesive 35 to the lower surface of the supporting region 13 of the substrate 1. Further, a second semiconductor chip 2M is bonded via a layer of adhesive 36 to the upper surface of the supporting region 13. With this arrangement, each of the bump electrodes 26 is connected to a corresponding one of bump electrodes 26a, and the second semiconductor chip 2M has an upper surface bonded with a third semiconductor chip 2N. Each of electrodes 25a of the third semiconductor chip 2N, as well as each of electrodes 25b, is connected to a corresponding terminal pad of the conductive wiring region 10 of the substrate 1.

According to each of the above two arrangement, since the total of three semiconductor chips are stacked, it becomes possible to further increase integration density of these semiconductor chips. It should be noted that as should be clear from FIG. 24, if the wire W is used for connecting each of the three semiconductor chips 2A, 2B, 2K to predetermined locations in the substrate 1, a more pieces of wire W must be disposed at a greater density of the wire W. In such a case, bonding locations for wire W on the substrate 1 should preferably be shifted as shown in the figure, so that three kinds of wires W (W1, W2, W3) do not cross each other.

As exemplified above, the present invention can be applicable not only to cases in which two semiconductor chips are stacked, but also to cases in which three semiconductor chips are stacked, or even to cases in which four or more semiconductor chips are stacked.

Figure 26:
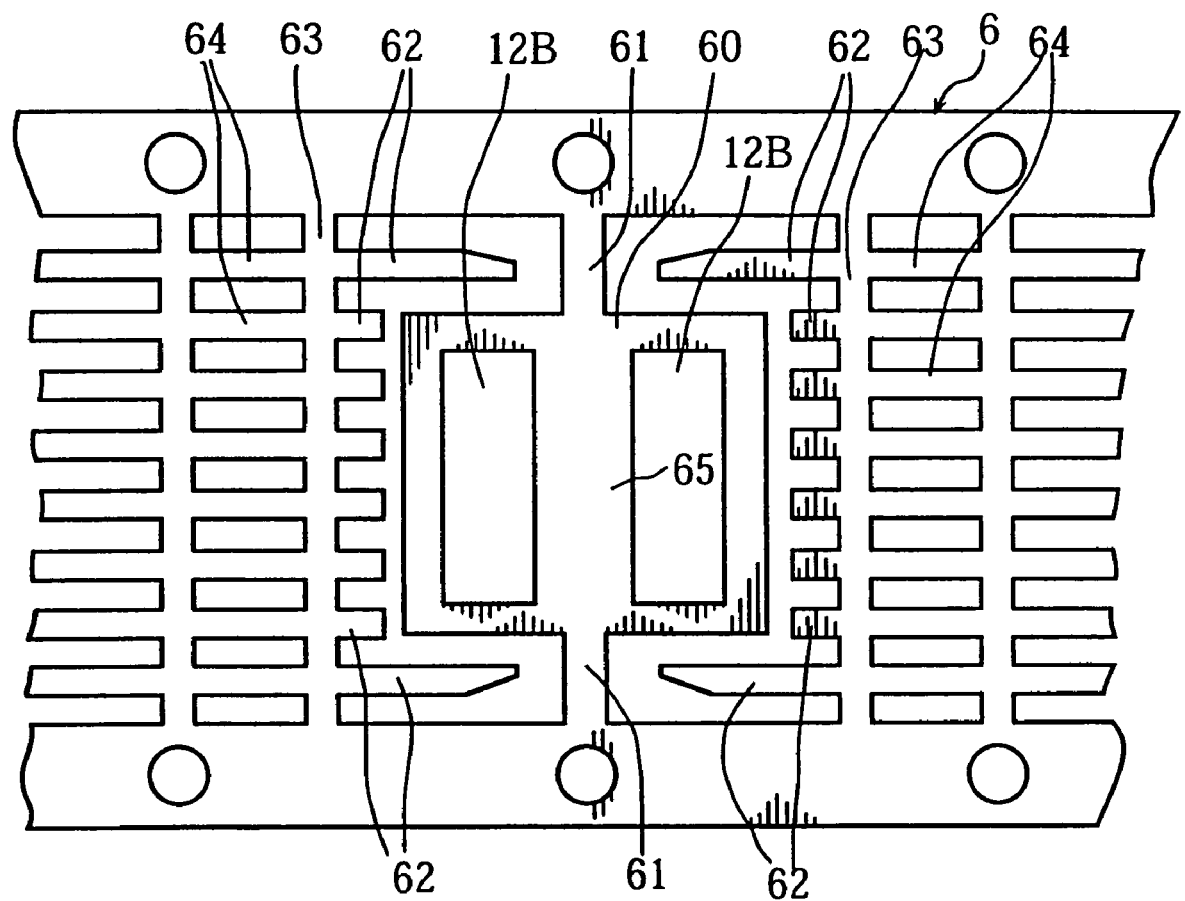
FIG. 26 is a plan view showing a principal portion of a lead frame for still another semiconductor device according to the present invention.
Figure 27:
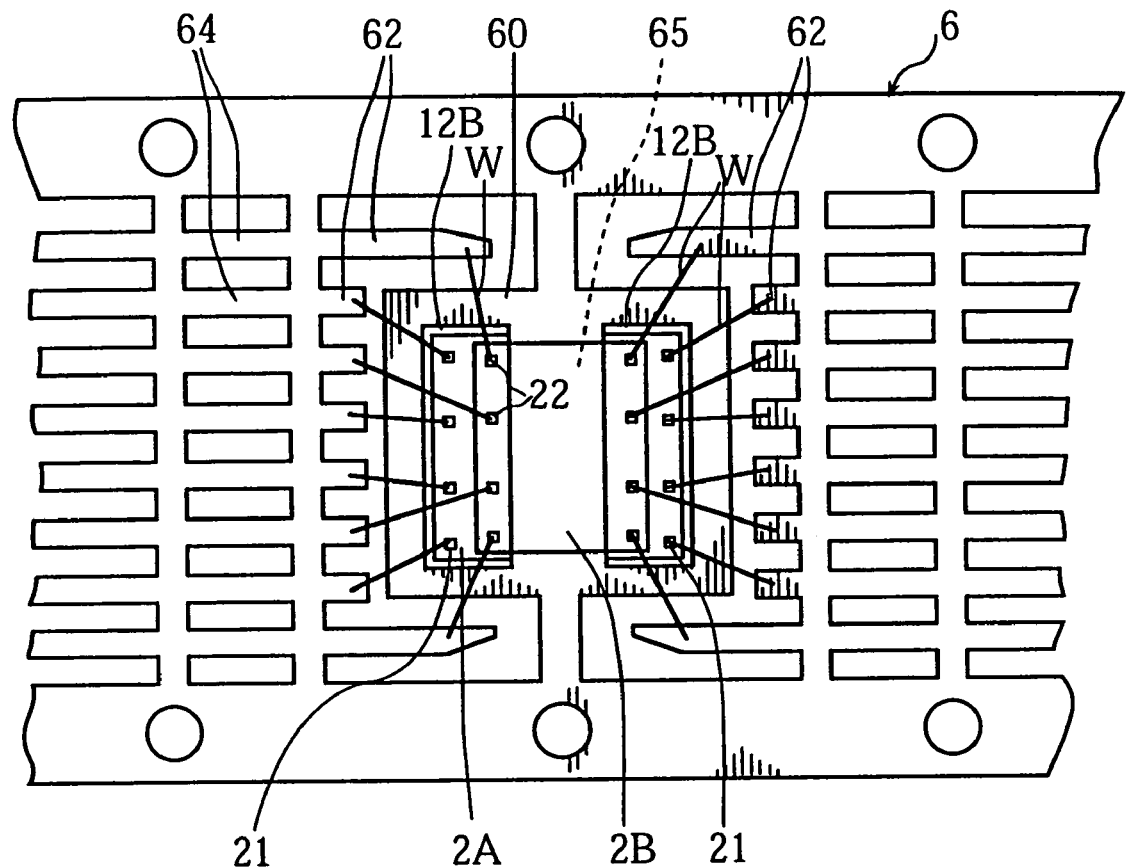
FIG. 27 is a plan view showing a principal portion of an intermediate product of the semiconductor device manufactured from the lead frame shown in FIG. 27.

FIG. 26 is a plan view showing a principal portion of a lead frame used for a semiconductor device according to the present invention. FIG. 27 is a plan view showing a principal portion of a semiconductor device manufactured from the lead frame shown in FIG. 26.

The lead frame shown in FIG. 26 is a long member made of a punched ribbon of metal such as copper, having generally the same arrangement as in a lead frame conventionally used for manufacturing semiconductor devices. Specifically, the lead frame 6 comprises a plurality of die-pads 60 for receiving semiconductor chips formed at a predetermined longitudinal interval, support leads 61 for supporting the die-pads, a plurality of internal leads 62 formed away from the die-pad 60, and a plurality of external leads 64 respectively connected to the internal leads 62 via tie-bars 63. Differing from the convention, however, this lead frame 6 has two openings 12B, 12B in the die-pad 60, with a supporting region 65 formed between these openings 12B, 12B.

FIG. 27 shows an arrangement in which the supporting region 65 of the above lead frame 6 is sandwiched vertically by the first semiconductor chip 2A and the second semiconductor chip 2B respectively bonded to the lower and upper surfaces of the supporting region 65. The main surface of the first semiconductor chip provided with the plural electrodes 21 faces upward, and these electrodes are below or at a lower level of the opening 12B, with no covering above. As a result, the electrodes 21 of the first semiconductor chip 2A can be properly connected via the wire W to corresponding internal leads 62. The plurality of electrodes 22 provided in the main surface of the second semiconductor chip 2B can also be connected properly to corresponding internal lead potions 62 via the wire W.

Figure 28:
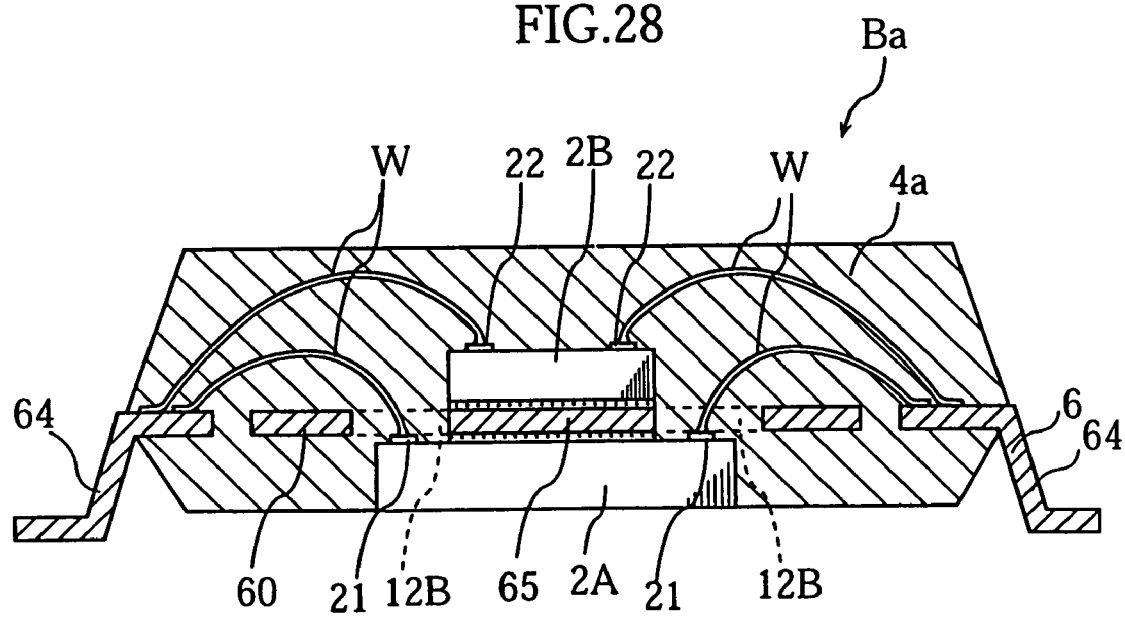
FIG. 28 is a sectional view showing a principal portion of the semiconductor device manufactured from the lead frame shown in FIG. 27.
Figure 29:
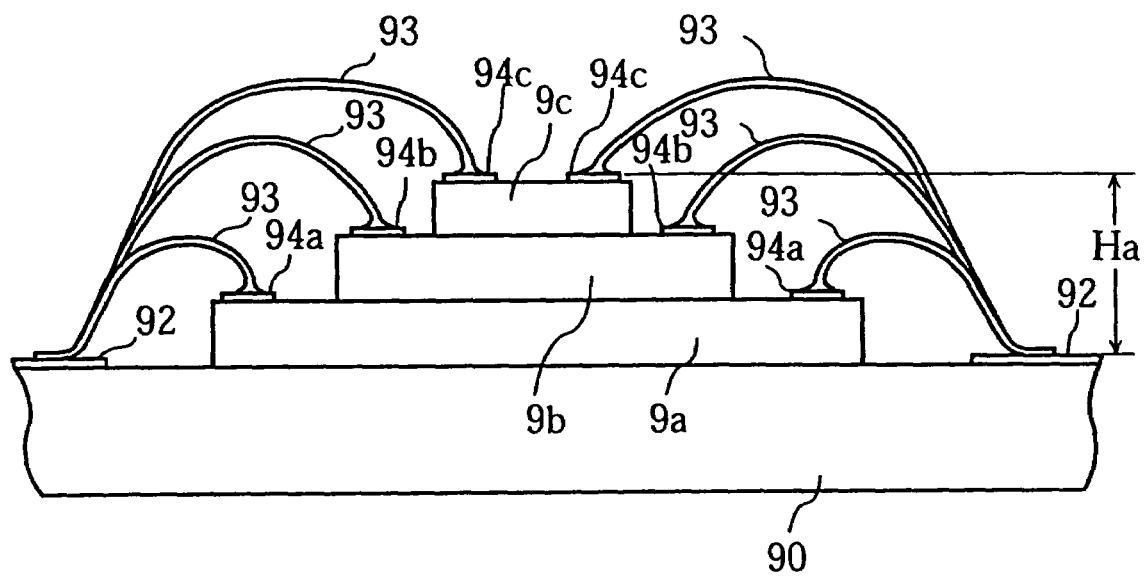
FIG. 29 is a view showing a prior art semiconductor device.
Figure 30:
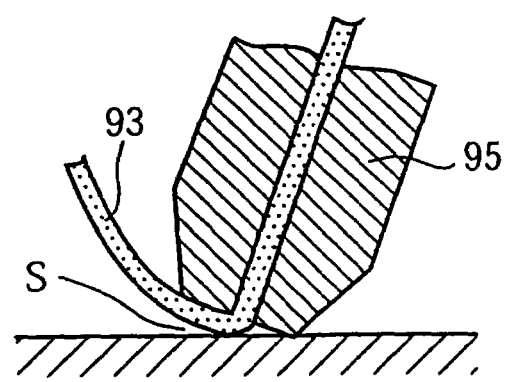
FIG. 30 is a sectional view of a principal portion showing a step of prior art wirebonding.

FIG. 28 shows a semiconductor device Ba obtained by packaging the two semiconductor chips 2A, 2B and a surrounding region thereof into a molding resin 4a, and then by performing a forming operation to the lead frame 6. These steps of resin packaging and frame forming are the same operations as performed in conventional manufacturing of semiconductors using a prior art lead frame. The external leads 64 serve as terminals for soldering the semiconductor device Ba, so that surface mounting to a desired location can be properly performed.

AS has been described above, according to the present invention, the supporting member for mounting the plurality of semiconductor chips may not only be a thin film substrate made of a synthetic resin, but also a lead frame made of a metal. Further, according to the present invention, the lead frame may be replaced for example, by a plate type ceramic substrate having a surface formed with a conductive wiring region, or a plate type substrate made of a synthetic resin such as epoxy resin. The present invention does not limit the kind of supporting member.

The present invention is not limited to those described above for each of the embodiments. The present invention is not limited by the kind of semiconductor chip of course. For example, the semiconductor chip may be a memory chip of a different kind such as ferroelectrics RAM, or other IC chips, LSI chips, or others.

The invention claimed is:

1. A method for manufacturing a semiconductor device which comprises:
   a first semiconductor chip having a main surface formed with a first set of electrodes;
   a second semiconductor chip having a main surface formed with a second set of electrodes in corresponding relationship to the first set of electrodes of the first semiconductor chip, the main surface of the second semiconductor chip being also formed with a third set of electrodes located outwardly from the second set of electrodes; and
   a supporting member having an opening penetrating through the supporting member, the supporting member having a first surface and a second surface opposite to the first surface;
   the method comprising:
   attaching the second semiconductor chip to the first surface of the supporting member in a manner such that the third set of electrodes are wirelessly connected to the supporting member at positions outwardly from the opening; and
   mounting the first semiconductor chip to the second semiconductor chip in a manner such that the main surfaces of the first and second semiconductor chips face each other while the first set of electrodes of the first semiconductor chip are wirelessly connected to the second set of electrodes in the opening of the supporting member.

2. The method according to claim 1, wherein the main surface of the first semiconductor chip is bonded to the second surface of the supporting member via an adhesive layer.

3. The method according to claim 1, wherein the main surface of the first semiconductor chip is entirely contained in the opening of the supporting member.

* * * * *